(12) United States Patent
Kenington

(10) Patent No.: US 7,595,689 B1
(45) Date of Patent: Sep. 29, 2009

(54) PREDISTORTER

(75) Inventor: Peter B. Kenington, Chepstow (GB)

(73) Assignee: Andrew LLC, Hickory, NC (US)

( * ) Notice: Subject to any disclaimer, the term of this patent is extended or adjusted under 35 U.S.C. 154(b) by 0 days.

(21) Appl. No.: 09/743,003

(22) PCT Filed: Jul. 2, 1999

(86) PCT No.: PCT/GB99/02110

§ 371 (c)(1),
(2), (4) Date: Jun. 16, 2004

(87) PCT Pub. No.: WO00/02324

PCT Pub. Date: Jan. 13, 2000

(51) Int. Cl.
*H03F 1/26* (2006.01)

(52) U.S. Cl. .................... 330/149; 330/151

(58) Field of Classification Search ............. 330/149, 330/151
See application file for complete search history.

(56) References Cited

U.S. PATENT DOCUMENTS

| | | | |
|---|---|---|---|
| 3,772,617 A * | 11/1973 | Ciesielka | 333/18 |
| 4,580,105 A | 4/1986 | Myer | 330/149 |
| 4,929,906 A | 5/1990 | Voyce et al. | 330/149 |
| 5,155,448 A | 10/1992 | Powell | 330/149 |
| 5,166,634 A | 11/1992 | Narahashi et al. | 330/151 |
| 5,334,946 A | 8/1994 | Kenington et al. | 330/144 |
| 5,351,016 A | 9/1994 | Dent | 332/103 |
| 5,420,536 A | 5/1995 | Faulkner et al. | 330/149 |
| 5,770,971 A | 6/1998 | McNicol | 330/52 |
| 5,796,304 A | 8/1998 | Gentzler | 330/52 |
| 6,081,156 A | 6/2000 | Choi et al. | 330/52 |
| 6,166,601 A | 12/2000 | Shalom et al. | 330/151 |
| 6,298,097 B1 | 10/2001 | Shalom | 375/297 |

FOREIGN PATENT DOCUMENTS

| | | |
|---|---|---|
| EP | 0 054 811 A1 | 6/1982 |
| EP | 0 289 130 A2 | 2/1988 |
| EP | 0 544 117 A1 | 6/1993 |
| JP | 56085909 | 7/1981 |
| JP | 356085909 A * | 7/1981 |
| WO | WO 92/20146 | 11/1992 |

* cited by examiner

*Primary Examiner*—Michael B Shingleton
(74) *Attorney, Agent, or Firm*—Mendelsohn, Drucker & Associates, PC; Steve Mendelsohn

(57) ABSTRACT

A predistorter arrangement for linearizing an amplifier. The predistorter arrangement is designed to compensate for IMD distortion in an amplifier using polynomial approximation techniques. The predistorter arrangement also includes pilot based feedback circuitry for controlling the operation of the predistorter.

20 Claims, 23 Drawing Sheets

PREDISTORTER

FIELD OF THE INVENTION

This invention relates to a predistorter arrangement for linearising a distorting element. In particular, the present invention relates to a polynomial predistorter arrangement designed to compensate for IMD distortion in an amplifier using pilot based control.

BACKGROUND OF INVENTION

In an ideal system, a linear amplifier provides uniform gain throughout its dynamic range in order that the output signal of the amplifier is a correct, amplified version of the input signal. In reality however all linear amplifiers exhibit non-ideal properties such as amplitude and phase distortion, which are undesirable and can seriously deteriorate the performance of a system. One effect of this non-linearity of the amplifier is the generation of output frequencies equal to the sums and differences of integer multiples of the input frequency components. This effect is known as intermodulation distortion (IMD) and is particularly undesirable in high-power radio frequency (RF) amplifiers designed for use in broadband systems. For example, a broadband amplifier used in the TDMA cellular system will generate various intermodulation products as a result of amplifying a multitude of TDMA channels occurring at fixed frequency intervals across a TDMA band, with coincident active frames.

A number of linearisation techniques have been developed to overcome the above distortion problems associated with a linear amplifier. A few of these techniques operate in real-time to account for time dependent changes in the non-linear characteristics of the amplifier. Such changes may result from, for example, temperature variations in the amplifier, ageing of amplifier components, power supply fluctuations, or, most particularly, changes in the operating point of the amplifier due to a change in the number or power of the input carriers. Of the broadband, RF-based linearisation techniques, the two most commonly used are feed forward linearisation and predistorter linearisation.

A feed forward linearisation mechanism relies on creating an error signal representative of the IMD products introduced by the linear amplifier, and feeding this signal forward to combine with the output spectrum of the amplifier, canceling out the unwanted distortion. In order for the cancellation process to operate correctly, it is necessary for the mechanism to accurately adjust the amplitude and phase of the error signal prior to combining it with the output of the amplifier. This typically involves the use of additional amplifiers and lossy delay lines and couplers appearing in the output path from the main amplifier. These losses and the requirement for additional amplifiers, which are not adding to the output power of the system, result in a low-efficiency solution. In a pilot based feed forward mechanism, a pilot signal is injected into the amplifier input. This (amplified) pilot signal then appears in the error signal which is itself fed forward to cancel the original injected pilot signal as well as the distortion signals in the amplifier output. Correct adjustment of the amplitude and phase of the error signal is achieved based on measurements of residual pilot signal remaining after the cancellation process.

In general, predistortion linearisation mechanisms involve deliberate alteration of the relatively low level input signal to the amplifier in anticipation of the undesired distortion process occurring within the amplifier. Specifically, the mechanism predistorts the input signal in an inverse sense to the distortion produced by the amplifier such that in series the overall distortion is minimised. Accordingly, the transfer characteristic of the predistorter is approximated as closely as possible to the inverse or complementary function of the transfer characteristic of the amplifier. If the linear amplifier is compressive, i.e. the gain tails off at higher power levels, then the predistorter will compensate for this compression by correspondingly expanding the input signal.

Several approaches exist for predistorting the input signal, each differing in the way the predistorter approximates the inverse or complementary function. One approach approximates the inverse function with the exponential characteristics of a diode. One or more diodes may be used together with appropriate biasing to achieve a reduction of the distortion in the order of 10 dB. A second approach is to perform a piecewise approximation of the inverse function using a series of linear gain, straight line elements interconnected end-to-end. A drawback with this approach is that the alignment and control of the line elements requires complex circuitry owing to the interconnection points having two degrees of freedom.

Polynomial predistortion is another approach to approximating the inverse function of the amplifier transfer characteristic. It is based on a polynomial expansion of the inverse function which may be expressed as follows:

$$y = a + bx + cx^2 + dx^3 + ex^4 + fx^5 + gx^6 + hx^7 \ldots$$

The term a is an offset which may be set to zero in a practical polynomial predistorter. The term bx represents the gain of the predistorter which is linear and merely contributes to the gain of the main amplifier. The terms containing even powers of x represent harmonic distortion components generated in the main amplifier which may be removed using frequency filtering, and therefore these terms may also be set to zero. The remaining terms containing odd powers of x represent in-band distortion caused by the main amplifier (in addition to harmonics which can be filtered as above). In fact, each of these odd-power terms may be considered to represent the equivalent order of intermodulation distortion generated in the main amplifier.

SUMMARY OF THE INVENTION

According to a first aspect of the present invention there is provided a predistorter arrangement for linearising a distorting element, the predistorter arrangement comprising predistorter means for processing an input signal which is required to be processed by the distorting element, to produce a predistorted input signal which is supplied to an input of the distorting element, pilot means for generating a pilot signal in the input signal, and error correction means for detecting the presence of distortion signals derived from the pilot signal in the distorting element output signal to produce an error correction signal for controlling the processing of said input signal in the predistorter means.

A predistorter arrangement in accordance with the invention has the advantage of implementing control on the basis of a pilot signal which has known characteristics and so can provide improved error correction. The use of a pilot signal also has an advantage in enabling the predistorter arrangement to be applied more than once for a single distorting element.

Preferably, the distorting element is an amplifier.

Ideally, the predistorter arrangement further comprises means for removing from the amplifier output signal the amplified pilot signal prior to detecting the presence of distortion signals derived from the pilot signal in the amplifier output signal. This has the advantage of reducing contamination of the amplified signal with unnecessary extra signals. However, in an alternative embodiment there is no means for removing the amplified pilot signal and the pilot signal remains in the output. It may, for example, be deliberately placed outside of the band of interest and ultimately removed using band-pass filtering of the system output signal.

Preferably, the pilot means adds a pilot signal to the input signal. An advantage with this is that generation of the pilot signal can be performed with minimum deterioration of the input signal.

In a first preferred embodiment, the pilot signal is a single tone signal. In this embodiment, the error correction means preferably detects the presence of distortion signals derived from cross-modulation of the components onto the pilot signal input signal. The use of a single tone signal also has the advantage that it may be removed from the output of the amplifier using a straightforward and efficient process to a high degree of cancellation.

In a second preferred embodiment, the pilot signal is a multiple tone signal. In this embodiment, the error correction means preferably detects the presence of distortion signals derived from intermodulation of the multi-tone pilot signals. The multi-tone pilot signal may be a two-tone signal or any other suitable number of tones (modulated or otherwise).

In embodiments in which the pilot signal includes a tone signal, the frequency of the tone signal may be frequency hopped, or modulated with an appropriate modulation format, or both. Frequency hopping provides an advantage that pilot signals which clash with the input signal may be averaged out with non-clashing pilot signals.

In a third preferred embodiment, the pilot signal is derived from the input signal. In this embodiment, the pilot signal may be a frequency translated, intentionally modulated or intentionally distorted, copy of the input signal.

In a preferred embodiment, the predistorter means comprises an input signal path for receiving an input signal which is required to be amplified, and a distortion path in which an input signal from the input signal path is processed to generate a distortion signal, which is combined with the input signal in the input signal path to produce the predistorted input signal.

The distortion path preferably includes means for adjusting the distortion signal in dependence on the error correction signal, and the adjustment means may enable adjustment of the distortion signal in phase and amplitude.

In one embodiment, the adjustment means comprises a variable phase shifter and a variable attenuator.

In another embodiment, the adjustment means comprises an in-phase adjustment means and a quadrature phase adjustment means.

Preferably, the correction means correlates the amplifier output signal with the distortion signal to produce the error correction signal.

According to a second aspect of the present invention there is provided a method for linearising a distorting element, including a predistorter step in which an input signal which is required to be processed by the distorting element is processed to produce a predistorted input signal which is supplied to an input of the distorting element, a pilot generation step in which a pilot signal is generated in the input signal, and an error correction step in which the presence of distortion signals derived from the pilot signal in the distorting element output signal is detected to produce an error correction signal which controls the step of processing the input signal.

Preferably, the distorting element is an amplifier.

According to a third aspect of the present invention there is provided a control circuit for controlling a predistorter section of a predistorter amplifier, the circuit having pilot generator means for coupling to an input of the predistorter section to add a pilot signal to signals input to the predistorter amplifier, and error correction means for coupling to an output of the amplifier to sample signals output from the amplifier and to detect the presence of distortion signals derived from the added pilot signal, and for coupling to adjustment circuitry in the predistorter section to adjust the predistorter in dependence on the detected distortion signals.

Preferably, in each aspect of the invention, the pilot signal and/or error correction makes use of digital signal processing (DSP) techniques to reduce the effect of DC offsets produced by analogue components. Ideally, this includes frequency offsetting the pilot signal and/or the error correction signal by an audio frequency, for example, to maintain phase dependent information.

Further features and advantages of the invention will be apparent from the description below.

BRIEF DESCRIPTION OF THE DRAWINGS

Embodiments of the invention will now be described, by way of example, with reference to the accompanying drawings, in which.

Various types of predistorter will now be described, by way of example, followed by descriptions of pilot based control mechanisms suitable for use with these predistorters.

DETAILED DESCRIPTION

Predistorters

Figure 1:
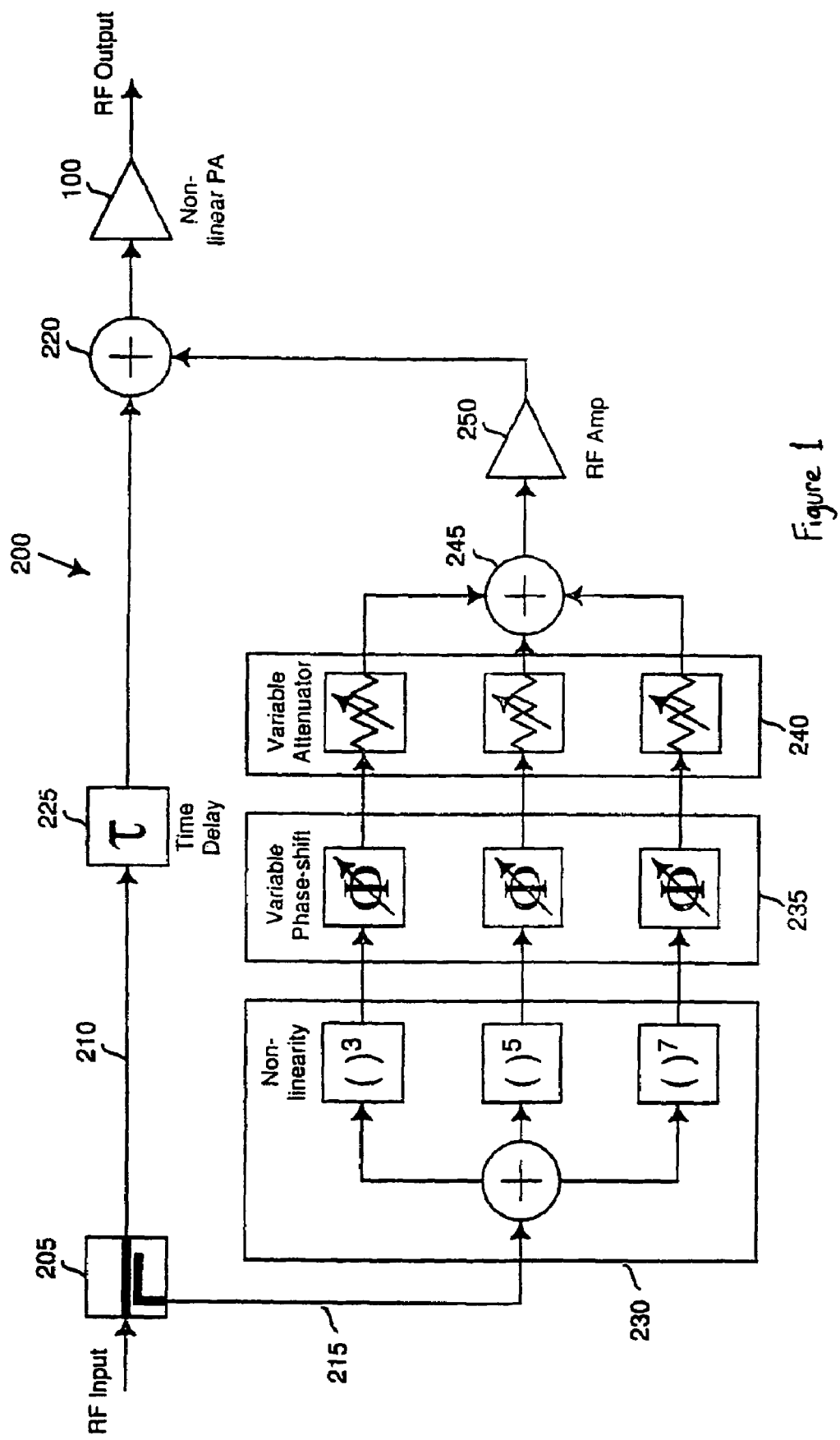
FIG. 1 is a block diagram of a multiple-order scalar polynomial predistorter.

Referring to FIG. 1, there is shown a multiple order polynomial predistorter 200 having an input for receiving an RF input signal and an output for supplying a predistorted signal to an RF power amplifier 100. The RF input signal received at the input of the predistorter is split by the splitter 205 between two channels or paths, the main path 210 supplying the main RF signal for subsequent amplification, and the distortion path 215 supplying multiple orders of distortion for adding to the main RF signal.

Figure 10A:
FIGS. 10a, 10b, 10c, 10d, 10e, 10f are frequency spectra for signals occurring at various points in the circuits of FIGS. 1 to 9 in operation.

The main RF input signal from the main path 210 and the distortion signal from the distortion path 215 are summed in the adder 220 prior to being amplified in the RF power amplifier 100. The main path includes a time delay component 225 to ensure that the main RF signal and the distortion signal coincide at the adder 220. In an ideal operation of the predistorter, the output signal from the RF power amplifier 100 will represent a linearly amplified version of the RF input signal. An example of a possible RF input signal in the form of two closely spaced frequency tones is shown in FIG. 10a.

Figure 10B:
Figure 10C:
Figure 10D:
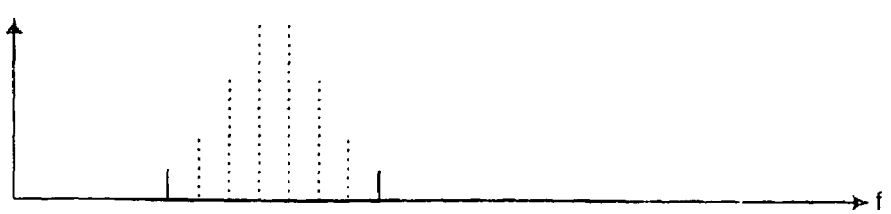

The RF signal entering the distortion path 215 is fed into a distortion generation circuit 230 which operates on the RF input signal to generate a set of non-linear distortion components each corresponding to a particular order of distortion. In FIG. 1, the orders of distortion generated at the three output paths of the distortion generation circuit 230 are third order, fifth order, and seventh order, illustrated as frequency spectra in FIGS. 10b, 10c, and 10d, respectively. It is also possible for the distortion generation circuit to generate higher order distortion components such as ninth order, or to generate only third order, or third and fifth order distortion components.

The signals output from the distortion generating circuit 230 are independently adjusted in phase by the set of variable phase-shift components 235 to compensate for any differing phase shifts occurring in the distortion generating circuit 230. The distortion signals are then independently adjusted in amplitude by the set of variable attenuators 240. The amplitude adjustment ensures that the relative levels of the separate distortion components are set to correctly correspond to the relative levels of the orders of distortion generated intrinsically in the RF power amplifier 100.

The correctly adjusted signals representing the third, fifth and seventh orders of distortion are then summed in the adder 245 to produce a single multiple order distortion signal. This signal is fed into an RF amplifier 250 which controls the level of the multiple order distortion signal relative to the main RF signal on the main path 210.

As discussed previously, a predistorter operates by predistorting an input signal in an inverse sense to the distortion produced by the amplifier. In the predistorter of FIG. 1, higher order distortion components are added at an appropriate phase to the input signal to cancel corresponding distortion generated within the amplifier. This assumes that the distortion signals generated in the amplifier are in-phase with the signal being amplified, ie the distortion results from a predominantly amplitude modulation to amplitude modulation (AM-AM) transfer characteristic in the amplifier. Accordingly, the predistorter of FIG. 1 may be referred to as a scalar predistorter.

There is however another distortion generating effect associated with power amplifiers which results from an amplitude modulation to phase modulation (AM-PM) transfer characteristic in the amplifier. This form of distortion is characterised by phase variations in the amplified signal which are dependent on the amplitude variations of the input signal.

A scalar predistorter will only be able to linearise an amplifier using AM-AM compensation to a point where the AM-PM distortion becomes dominant over the AM-AM distortion. For amplifiers with a small amount of AM-PM conversion, such as high-quality class-A amplifiers, this is generally not a problem. However, problems can occur in situations where the magnitude of AM-PM distortion in a amplifier is comparable with the magnitude of AM-AM distortion, or where it is required to have a high degree of linearisation in the predistorter/amplifier combination, in which situations a scalar predistorter will operate less effectively. In a class-C amplifier, for example, the AM-PM distortion is usually of a similar magnitude to the AM-AM distortion, and consequently a scalar predistorter will show little or no improvement in the amplifier linearity. Similarly, in the situation where a scalar predistorter uses a fifth order polynomial approximation or higher, the improvement in the AM-AM compensation may not be mirrored by a corresponding improvement in the amplifier linearity due to an overpowering AM-PM distortion.

The combination of the AM-AM and AM-PM transfer characteristics of an amplifier may be mapped onto an in-phase I transfer characteristic of the amplifier and a quadrature phase Q transfer characteristics of the amplifier. A predistorter which generates inverse distortion components individually in each of the I and Q channels can therefore compensate for amplifier generated I and Q channel distortion brought about by the non-linear I and Q transfer characteristics of the amplifier. Such a predistorter may be referred to as a vector predistorter, owing to the use of mutually orthogonal I and Q predistorter components which can define a distortion signal vector in signal space.

Figure 2:
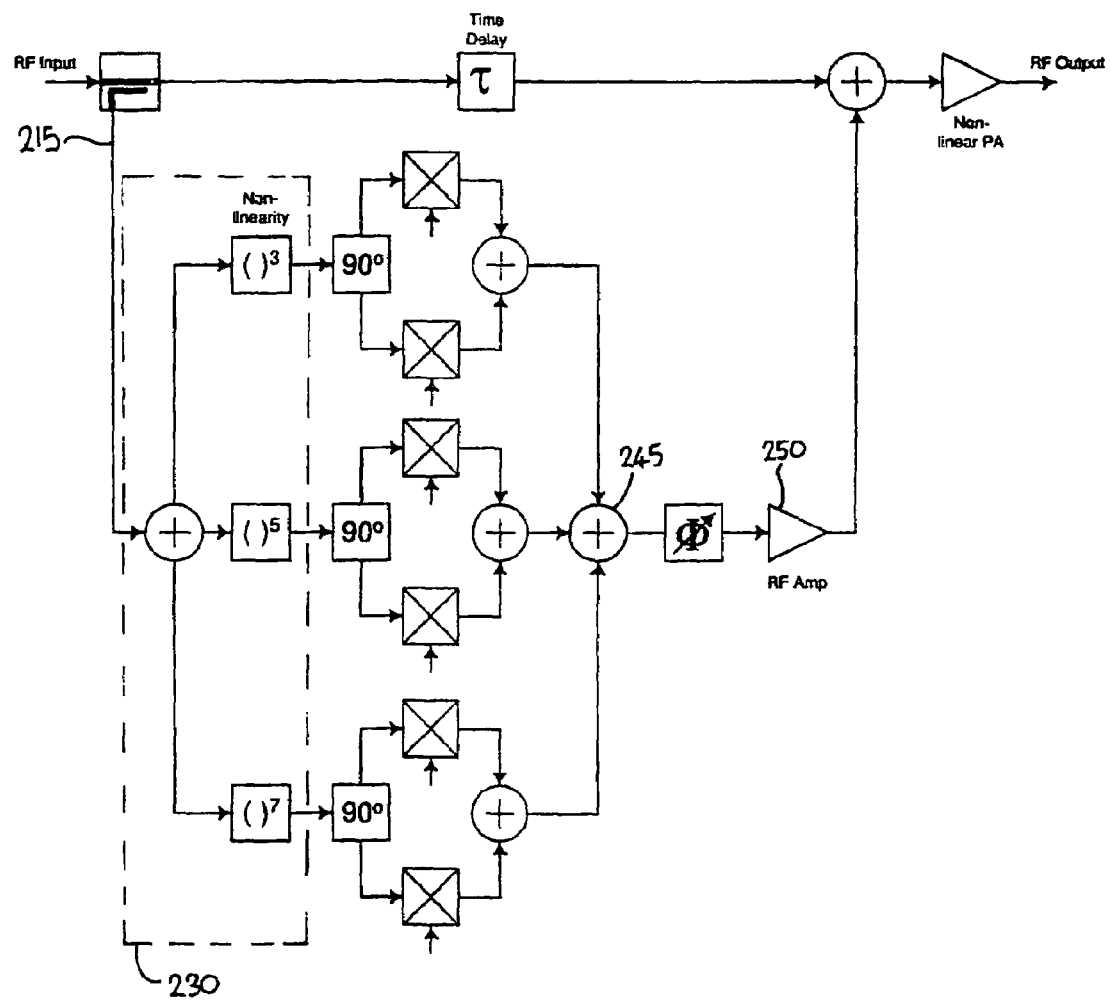
FIG. 2 is a block diagram of a multiple-order vector polynomial predistorter.

FIG. 2 is a block diagram showing a vector predistorter which compensates for third, fifth, and seventh order predistortion in both the in-phase I channel and the quadrature phase Q channel. This vector predistorter is a modified version of the scalar predistorter of FIG. 1 and like features are labelled with like references.

The solution shown in FIG. 2 uses mixers or multipliers fed with DC control signals to provide a true 360 degree vector modulator in each of the non-linearity orders.

Different versions of a distortion generation circuit suitable for use in the scalar and vector predistorters of FIGS. 1 and 2 will now be described, with reference to the block diagrams shown in FIGS. 3 to 9, and the frequency spectra in FIG. 10.

Figure 3:
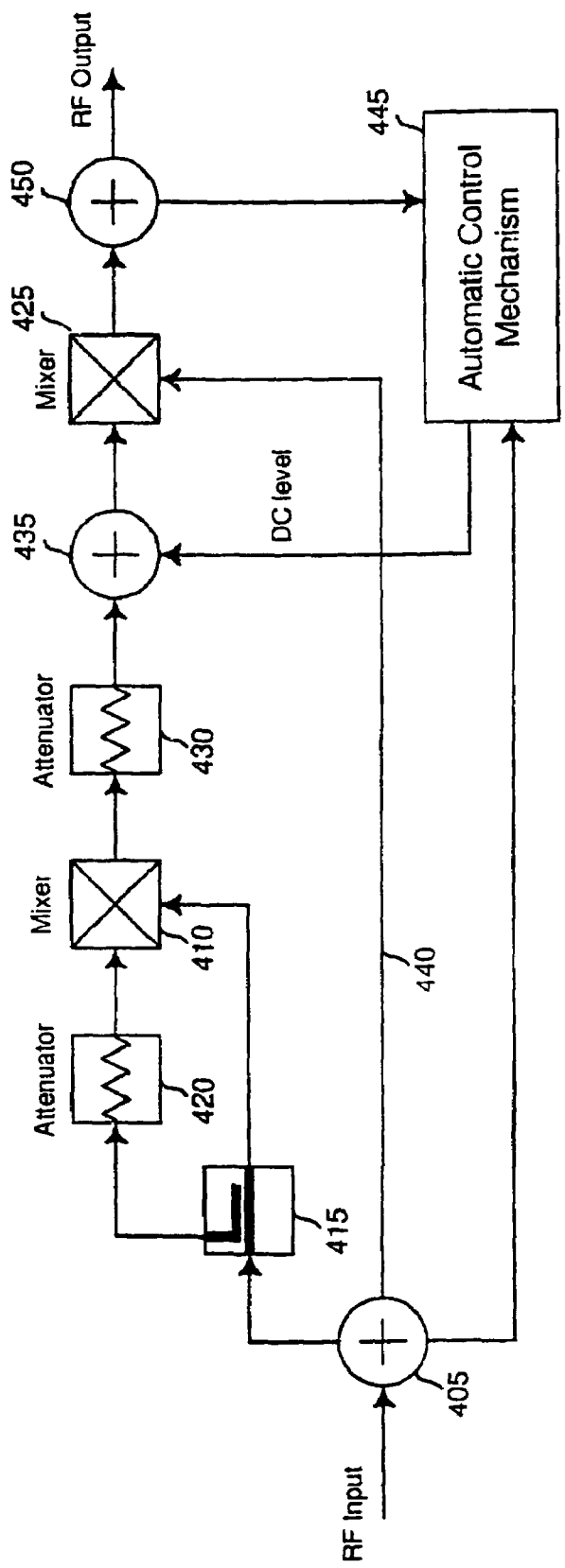
FIG. 3 is a block diagram of circuitry for generating a third order distortion component suitable for use in the polynomial predistorters of FIGS. 1 and 2.
Figure 10E:
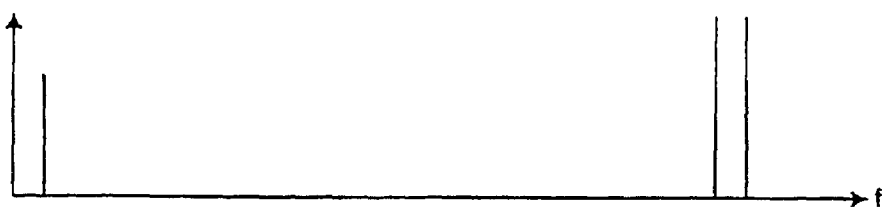

FIG. 3 shows a block diagram of a circuit for generating a third order distortion component. The RF input signal entering the circuit is split three ways by the splitter 405. One of the RF signals is then fed into the first input of a mixer or multiplier 410 via a directional coupler 415. The directional coupler samples a portion of the RF signal which is fed into the second input of the mixer 410 via an attenuator 420. By mixing the two versions of the same RF input signal, the output of the mixer 410 ideally generates a squared RF signal which contains frequency components in a DC zone, i.e. at low frequencies, and frequency components in a second harmonic zone, i.e. at double the original frequencies. The frequency spectrum of the squared RF signal is represented in FIG. 10e.

Figure 10F:
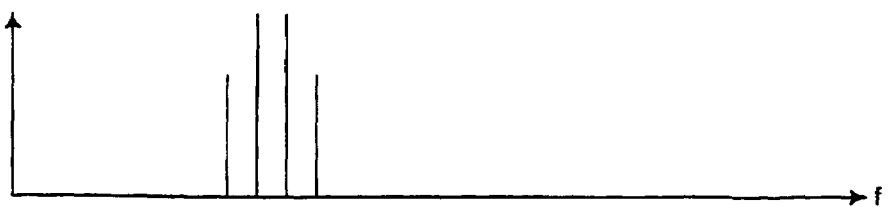

The squared RF signal output from the mixer 410 is then fed into the first input of a mixer 425 via an attenuator 430 and a DC injection summer 435. Another RF input signal from the splitter forms the second input to the mixer 425 and may be supplied via a path 440 including a time delay element (not shown) to ensure that the two mixer input signals are in phase. By mixing the squared RP signal with the original RF input signal, the output of the mixer 425 ideally produces a pure cubic signal. The frequency spectrum of the cubed RF signal is represented in FIG. 10f (after filtering to eliminate the DC-zone, harmonic and third harmonic components).

In order to enable improved control of the third order component generation, it is preferable to remove as much of the input tone energy present in the output as possible. Referring to the circuit of FIG. 3, this is achieved by injecting a DC signal via an adder 435 to the squared RF signal at an appropriate level such that when mixed with the RF input signal the input energy at the output of the circuit is cancelled. The position of the DC signal injection shown in FIG. 3 is preferable as the level of RF input to the mixer 410 is relatively high and is known to a high degree of certainty. The same cancellation of the input energy can however be achieved, albeit less efficiently and less predictably, by injecting a DC signal at other positions in the distortion generation circuit.

Although the DC signal level may be set to maximise cancellation of the input signal energy in the output of the distortion generating circuit, fluctuations and drifting of the various signals within the circuit will occur as a result of, for example, temperature variations of circuit components, ageing of circuit components, unpredictable variations in supply voltages, and variations in the level of the input signal(s). The distortion generation circuit therefore includes an automatic control mechanism 445 for initialising, maintaining, and controlling the DC signal at the correct level for maximum cancellation of the input signal energy. The automatic control mechanism operates using a feedback loop principle. The output of the distortion generation circuit is sampled by a splitter 450 and is fed into an input of the control mechanism. A second input of the control mechanism receives an RF input signal from the splitter 405, preferably via a time delay element (not shown), and functions as a reference signal for the RF input. The automatic control mechanism compares the sample from the output with the RF input reference signal, and provides as an output a DC signal level dependent on the level of RF input energy detected in the output sample.

Figure 4:
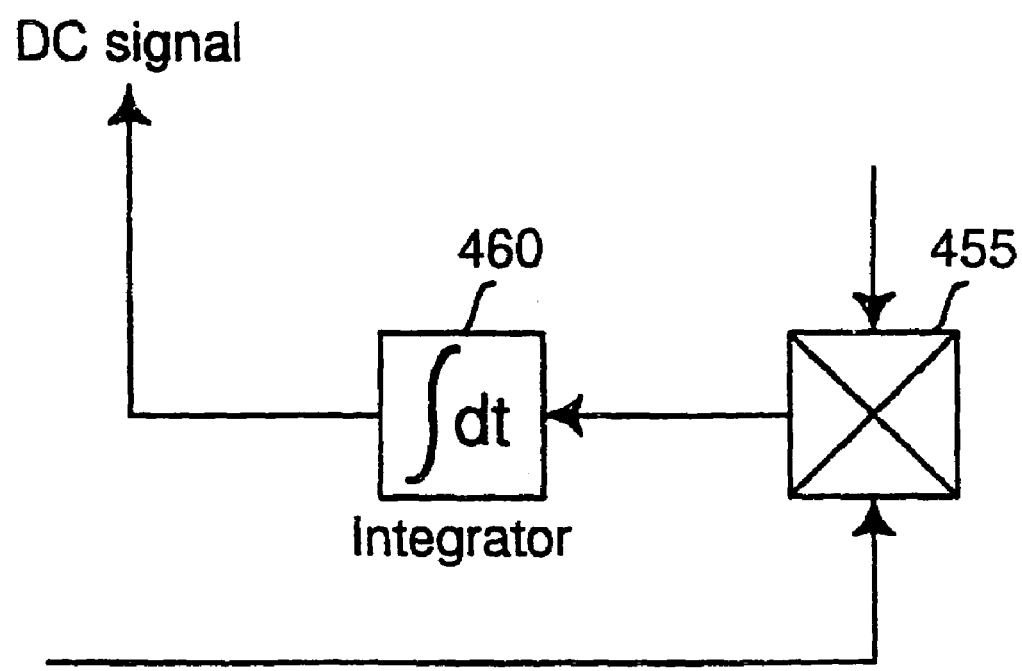
FIG. 4 is a block diagram of a feedback control circuit for use in the circuit of FIG. 3.

FIG. 4 shows an implementation of the automatic control mechanism in which a detection mixer 455 receives at one input the sample of the output signal and at another input the reference input signal. The detection mixer outputs a signal containing components across a range of frequencies. However, the output of the detection mixer of interest is the DC signal component, which provides a measure of the overlap of the unwanted input signal energy in the output with the reference input signal. This DC output is isolated from the other signal components in the detection mixer output by integration of the output in the integrator 460. The integrator has a time constant long enough to remove the unwanted non-DC signal components but short enough to provide millisecond response in the feedback. The DC output of the integrator provides the DC signal for injection into the adder 435.

Figure 5:
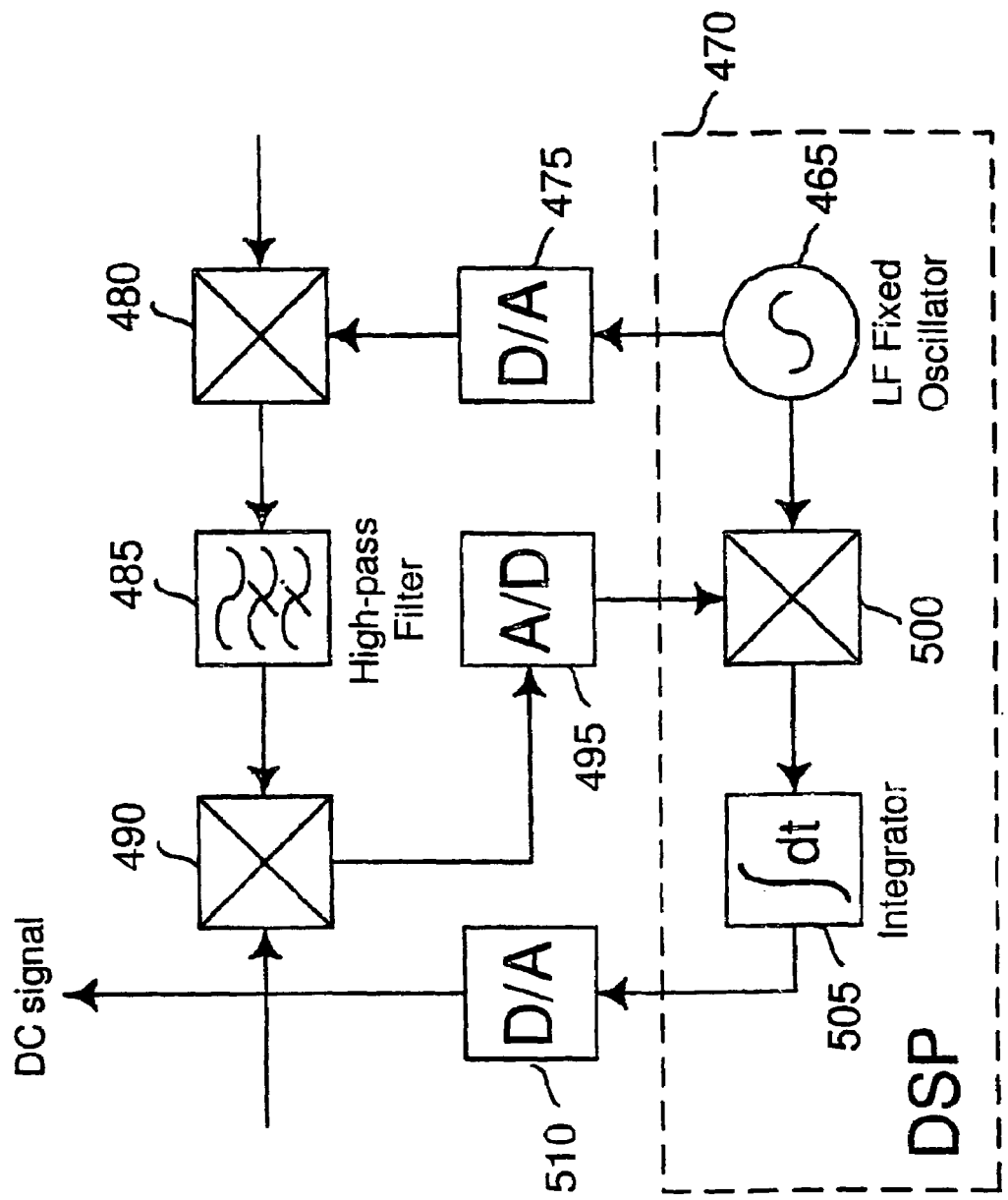
FIG. 5 is a block diagram of an enhanced feedback control circuit using digital signal processing techniques for use in the circuit of FIG. 3.

FIG. 5 shows a modified automatic control mechanism which incorporates offset frequency and digital signal processing (DSP) techniques to eliminate spurious DC offsets. Although the circuit is more complex than the circuit of FIG. 4, integration of the non-DSP components on an application specific integrated circuit (ASIC) chip means that the higher component count should not add significantly to the cost of this solution. The automatic control mechanism includes the same two inputs and one output as the circuit of FIG. 4, and operates as follows. A low frequency (LF) fixed oscillator 465 operating in the digital domain of a digital signal processor (DSP) 470 provides via a digital-to-analogue converter 475 a low frequency tone signal to an input of a mixer 480. The LF tone signal is ideally at an audio frequency $f_{LF}$ of between 1 and 5 kHz. The second input to the mixer 480 is the output sample supplied by the splitter 450 shown in FIG. 3, and contains signal components at a relatively higher frequency than the LF tone signal, e.g. between 100 and 2000 MHz. The effect of mixing the output sample with the LF tone signal is to generate an image of the output sample shifted down in frequency by $f_{LF}$ and an image of the output sample shifted up in frequency by $f_{LF}$. The output of the mixer 480 is processed by a high pass filter 485 which has a cut-off frequency chosen such that the filter 485 removes any LF tone signal leaking through the mixer 480. The frequency offset output sample is then fed into an input of a detection mixer 490, whilst a second input receives the reference RF input signal. As in the mechanism of FIG. 4, the detection mixer 490 provides at its output a signal containing components across a range of frequencies. However, in this mechanism it is the signal component at the tone frequency $f_{LF}$ which provides a measure of the overlap of the unwanted input signal energy in the output with the reference input signal.

After converting the output of the detection mixer 490 back into the digital domain of the digital signal processing (DSP) using the analogue-to-digital converter 495, the signal is fed into a digital mixer 500. It should be noted that the digital signal processor and the analogue-to digital converter are ideally suited to dealing with signals at audio frequency and can therefore accurately process the required signal component at the tone frequency $f_{LF}$. The digital mixer 500 mixes the output of the detection mixer 490 with the LF tone signal from the LF fixed oscillator 465 to convert the required signal component also at the tone frequency to a DC signal. As in the mechanism of FIG. 4, this DC signal is isolated from the other signal components produced in the detection mixer by integration of the digital mixer output in a digital integrator 505. However, unlike the mechanism of FIG. 4, this offset-frequency mechanism is immune to any build up of spurious DC signals in the analogue domain, i.e. in the mixers 480, 490, the D/A 475, the A/D 495 and the high-pass filter 485. The potentially damaging DC signals enter the digital signal processor via the analogue to digital converter (A/D) 495, but are immediately converted to the tone signal frequency $f_{LF}$ by the digital mixer 500 and are subsequently cancelled in the integrator 505. Because the digital mixer 500 and the integrator 505 both operate in the digital domain of the digital signal processor (DSP) they do not experience the problems of their analogue counterparts such as signal leakage or spurious DC offset generation due to temperature or power supply fluctuations. The DC signal output from the integrator provides via the digital-to-analogue converter 510 the DC signal for injection into the adder 435 of FIG. 3.

Figure 6:
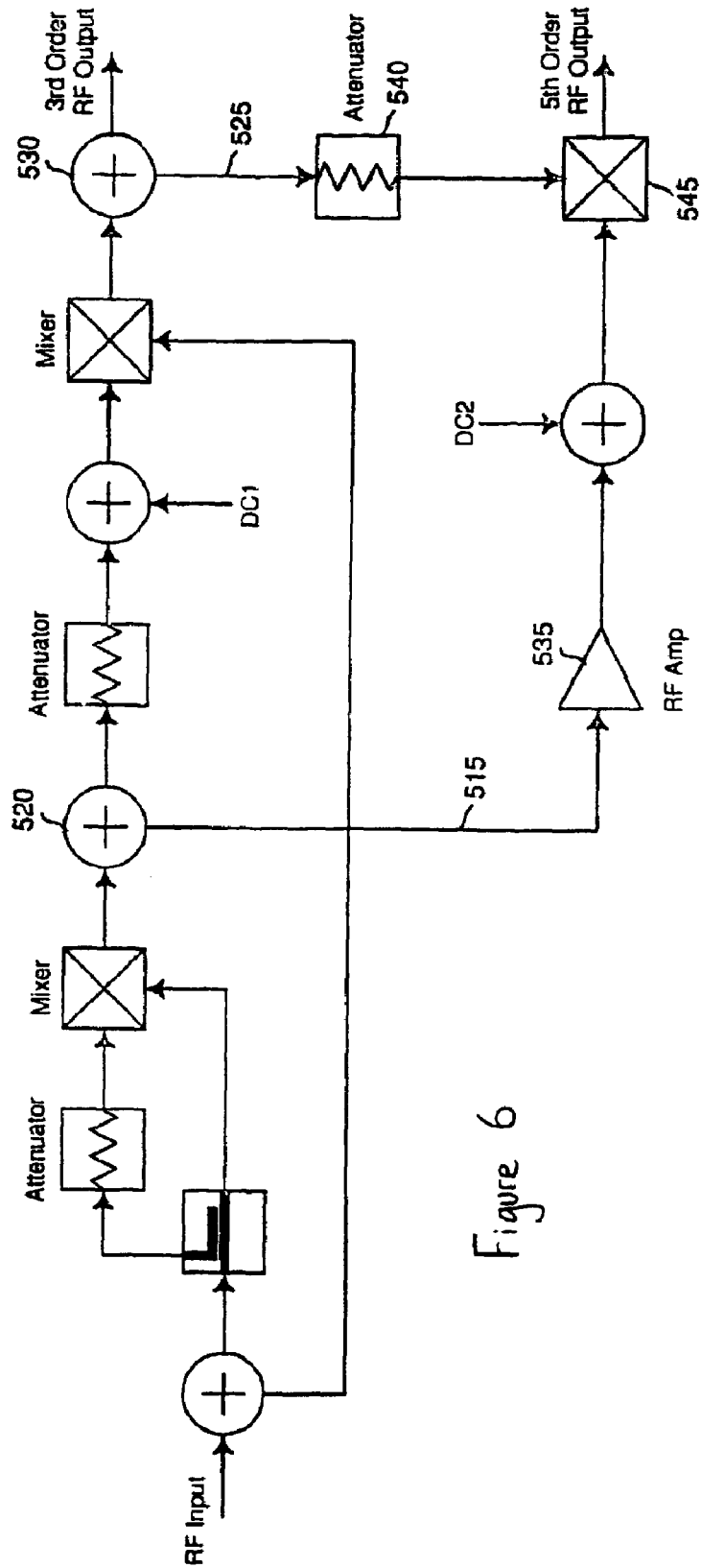
FIG. 6 is a block diagram of a circuit for generating third and fifth order distortion components suitable for use in the polynomial predistorters of FIGS. 1 and 2.
Figure 7:
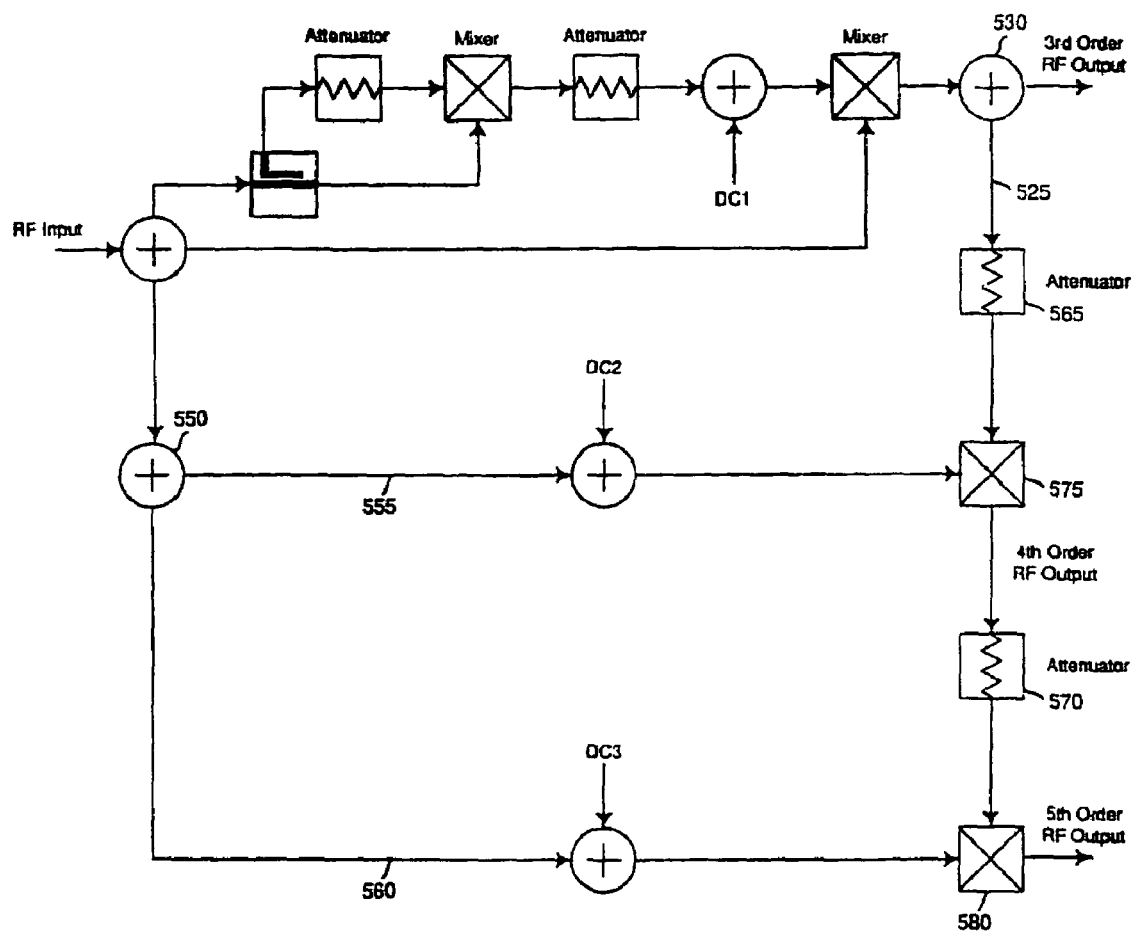
FIG. 7 is a block diagram of an alternative circuit for generating third and fifth order distortion components suitable for use in the polynomial predistorters of FIGS. 1 and 2.

FIGS. 6 and 7 are block diagrams of two alternative embodiments of a circuit for generating third and fifth order distortion components, and are based on the design and basic principles of operation of the third order generation circuit of FIG. 3. Like components have therefore been labelled with like references.

In the generation circuit of FIG. 6, the second order signal is divided into a second path 515 by a splitter 520, and the third order signal is divided into a second path 525 by a splitter 530. The second order signal level on the path 515, and the third order signal level on the path 525, are adjusted by an RF amplifier 535 and an attenuator 540 respectively. The adjusted second and third order signals are then mixed in the mixer 545 to produce a fifth order RF output. A second DC injection signal is added to the second order signal path 515 for mixing with the third order signal on the path 525. By adjusting the second DC signal to a suitable level, the third order signals, which would otherwise be present in the fifth order RF output, may be cancelled.

In the generation circuit of FIG. 7, the RF input signal is further divided by a splitter 550 into paths 555 and 560, and the third order signal is divided by a splitter 530 into a path 525. The third order signal is suitably attenuated by attenuators 565 and 570 which in turn feed the mixers 575 and 580. The mixers 575 and 580 mix the third order signal with the RF input signals on the paths 555 and 560 respectively. The output of the first mixer 575 generates a fourth order signal, and the output of the second mixer 580 generates the fifth order distortion signal for outputting.

Simulations performed on the generation circuit of FIG. 7 have shown that for fifth order distortion generation the first DC injection (DC1) to the adder 435 may not be required. The second DC injection (DC2) can provide significant cancellation of both the main signal energy and the third order energy leaving only the desired fifth order distortion. Removal of the first DC injection allows for simpler control of the fifth order distortion generation. However, a drawback of this solution is that the third order output no longer contains a pure third order distortion signal.

Figure 8:
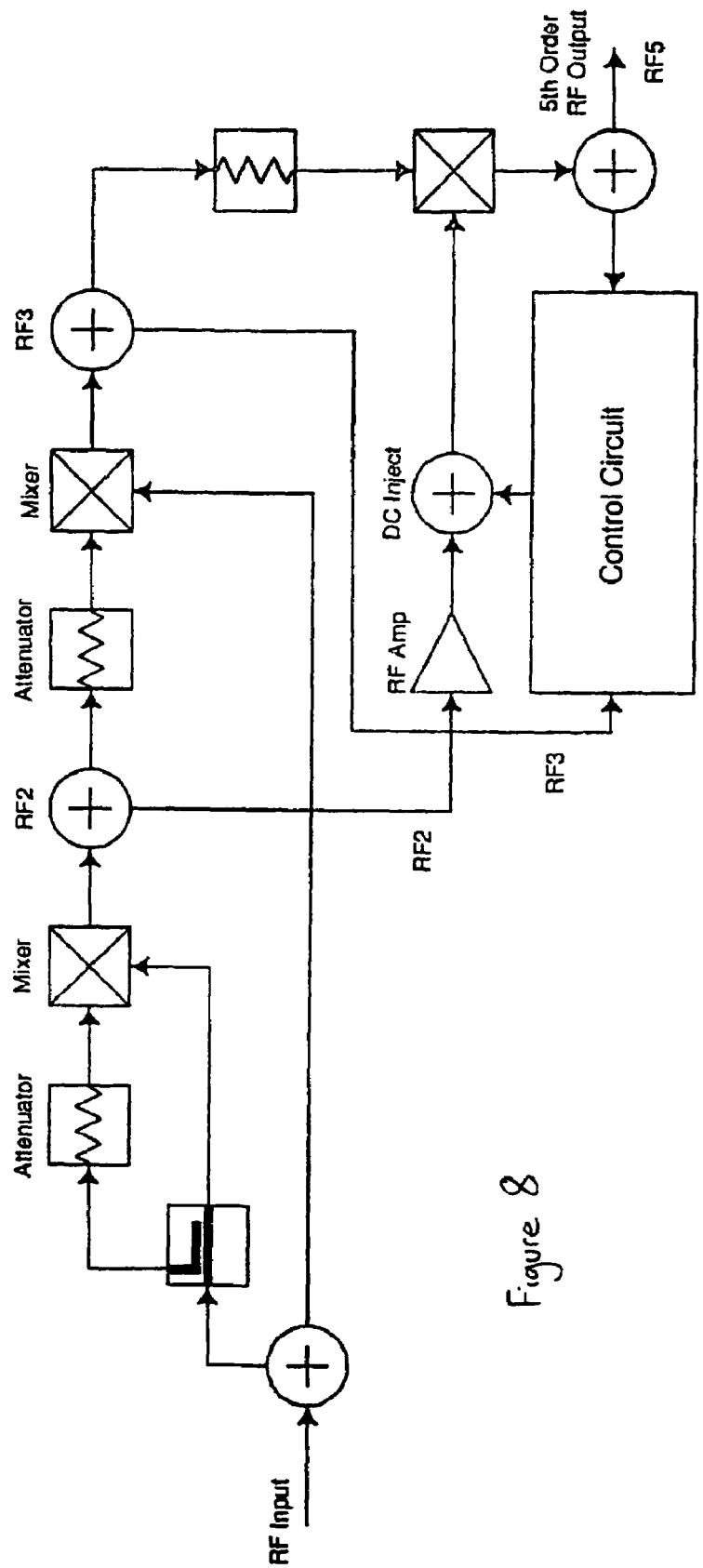
FIG. 8 is a block diagram of a circuit for generating a fifth order distortion component, based on the circuit of FIG. 6 and including a feedback control circuit.

FIG. 8 shows the circuit of FIG. 6 without the first DC injection and with a feedback control mechanism which controls and maintains the remaining second DC injection to the adder. This feedback control mechanism performs in a similar way as in the third order generation circuit, except that a sample of the fifth order output is compared with a reference signal sampled from the third order output. The feedback DC signal therefore provides a measure of the overlap of both the unwanted input signal energy and third order signal energy in the fifth order output. The feedback control mechanism may be implemented using the feedback circuit of FIG. 4 or FIG. 5.

Figure 9A:
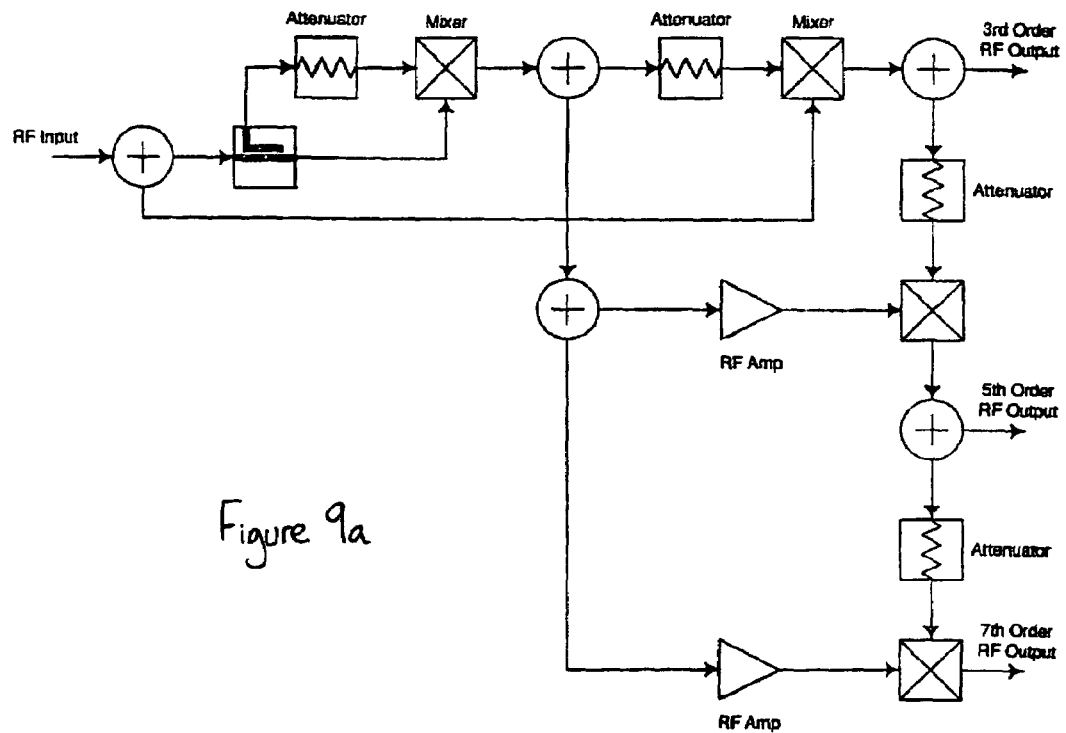
FIG. 9a is a block diagram of a circuit for generating third, fifth and seventh order distortion components.

FIG. 9a is a block diagram showing a circuit for generating a seventh order distortion signal based on the principle used in the fifth order generation circuit of FIG. 6. The fifth order signal is combined with the second order signal to generate a seventh order distortion output. Similar DC injection and control mechanisms to those described above may also be used with this system to enable the generation of only seventh order IMD products (ie. without the original input signals, or third or fifth order products).

Figure 9B:
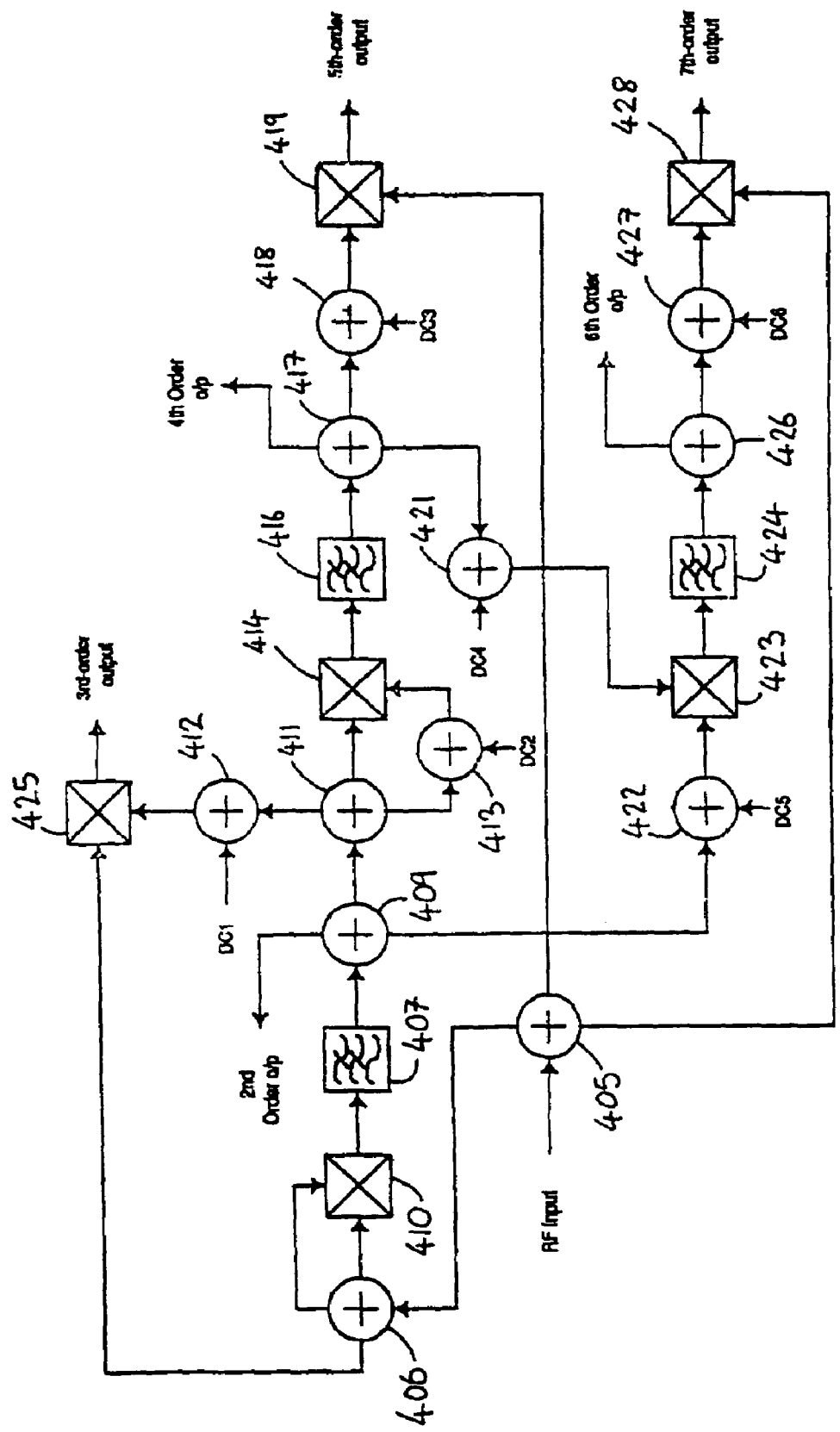
FIG. 9b is a block diagram of a circuit for generating second, third, fourth, fifth, sixth and seventh order distortion components.

FIG. 9b is a block diagram of a circuit for generating second, third, fourth, fifth, sixth and seventh order distortion components. The RF input signal is divided into three paths by a splitter 405, and one path is divided again into two paths by a splitter 406, and these two paths are combined in a mixer 410 to produce the second order component after passing through a low band-pass filter 407.

This second order component is in turn divided into three parts by a splitter 409, a first path being a second order output path, a second path leading to third, fourth and fifth order generation circuitry, and a third path leading to sixth and seventh order generation circuitry. The second path is divided again by a splitter 411 into three paths, a first one of which is combined with a first DC signal DC1 in an adder 412 so as to cancel any main order component present in the third order component output signal after the second order component is combined with the main order RF input signal in a mixer 425 to produce the third order component.

The second order components on the second and third output paths from splitter 411 are combined in a mixer 414 to produce the fourth order component, after being filtered in a low pass filter 416. A second DC signal DC2 serves to cancel any third order component present in the fifth order component output signal.

The fourth order component is divided into three paths, a first path being a fourth order output path, a second path being connected via a DC adder 421 to the sixth and seventh order generation circuitry, and a third path being connected via a DC adder 418 to a mixer 419 in which the fourth order component is combined with the main order RF input signal to produce the fifth order component. The adder 418 introduces a DC signal DC3 that cancels any main order component that may be present in the fifth order component signal. The seventh order component from the output of mixer 428 also has any third order component cancelled by a DC signal DC4. The fourth order signal is combined with the second order component in a mixer 423 so as to produce a sixth order component output after passing through a low pass filter 424. A DC signal DC5 is added to the second order component in adder 422 to cancel any fifth order component that may be present in the seventh order output from mixer 428.

The sixth order component is divided by a splitter 426 into a sixth order output path and an input path via a DC adder 427 to a mixer 428, in which the sixth order component is combined with the main order RF input signal to produce the seventh order component. The DC signal DC6 in adder 427 serves to cancel any main signal component present in the seventh order component input.

Predistorter Control Mechanisms

Figure 11:
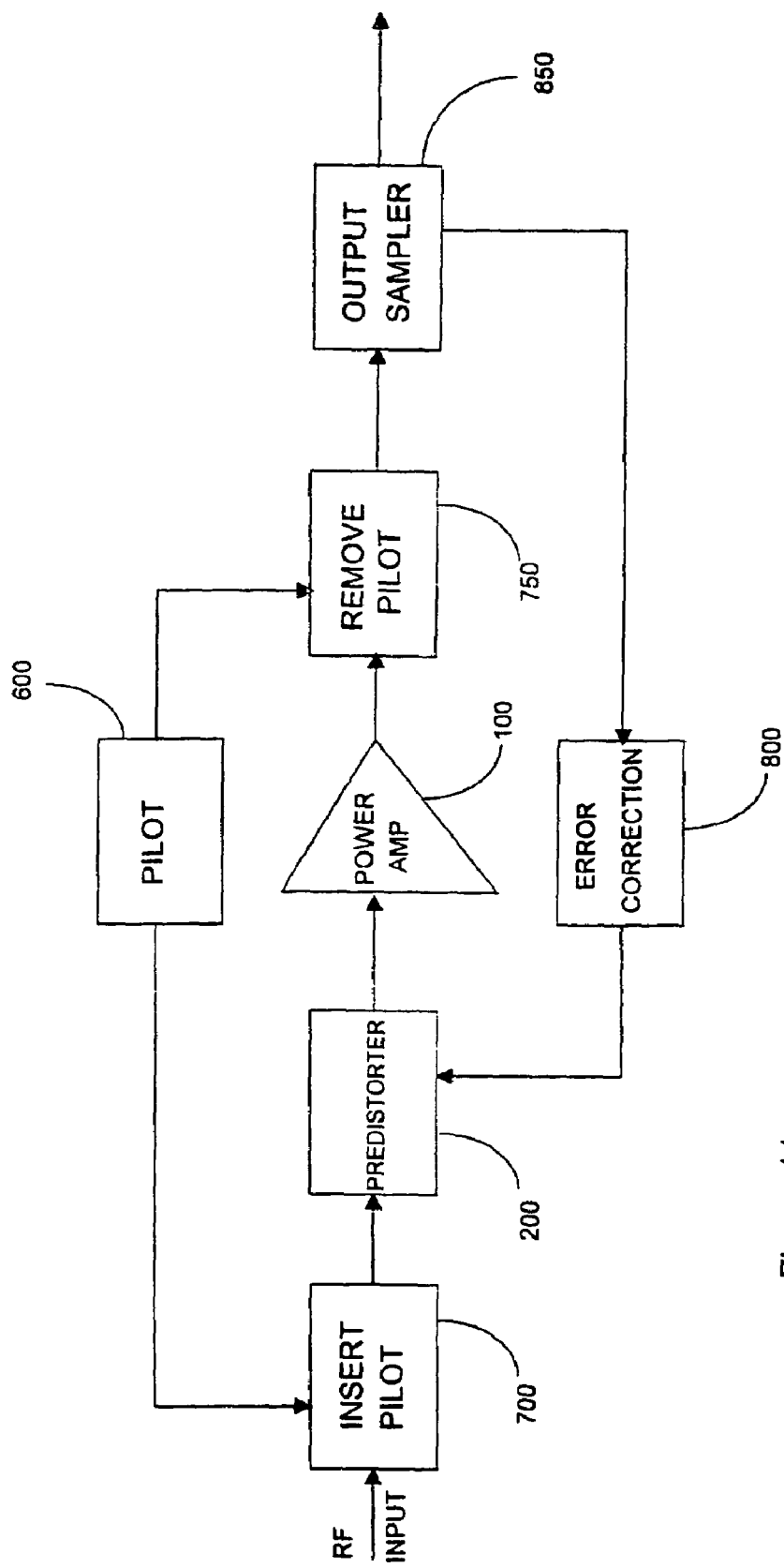
FIG. 11 is a block diagram showing a pilot based control scheme for controlling a predistorter power amplifier.

Referring to the block diagram of FIG. 11, there is shown a pilot based control scheme for controlling a predistorter power amplifier 200, 100. The predistorter 200 and power amplifier 100 combination may be, for example, any one of the combinations described previously with reference to FIGS. 1 to 10. The pilot based control system comprises a pilot signal generator 600 which generates a pilot signal, and an error correction circuit 800 which, based on pilot signal dependent measurements, corrects for any errors in the overall linearity of the system.

The pilot based control technique of FIG. 11 operates as follows. The pilot signal from the pilot signal generator 600 is supplied to circuitry 700 which injects the pilot signal into the RF input signal path. The pilot signal is then passed through the predistorted amplifier along with the RF input signal.

If the predistorter is adjusted correctly, the power amplifier 100 will output a linearly amplified version of both the RF input signal and the pilot signal. A linearly amplified version of the pure RF input signal may then be obtained by controlled removal of the amplified pilot signal from the amplifier output using the cancellation circuitry 750.

If the predistorter is adjusted incorrectly, however, the amplifier will output a non-linearly amplified version of both the RF input signal and the pilot signal, ie. the output of the amplifier will contain distortion. The distortion products generated at the amplifier output may be categorised as: i) intermodulation distortion derived purely from the RF input signal; ii) intermodulation distortion derived purely from the pilot signal; and iii) distortion derived from cross-modulation of the pilot signal and the RF input signal.

A feedback circuit 800, 850 operates to sample 850 the output of the power amplifier after removal of the pilot signal. The error correction circuitry 800 detects signals in the output spectrum which are derived from the pilot signal, ie. those distortion products in category ii) or iii). Based on this detection, the error correction circuitry produces a control signal which is representative of the non-linear characteristics of the predistorter and power amplifier combination. This control signal is used to adjust the predistorter 200 and to improve the overall linearity of the system. When the control system reaches a steady state and the non-linearities of the overall system are minimised, the control signal will remain constant apart from variations to correct for linearity errors due to temperature fluctuations, components ageing etc.

It should be noted that minimisation of the distortion in the amplifier output derived from the pilot signal automatically results in corresponding minimisation of the distortion derived purely from the RF input signal (category i)) thus providing complete linearisation of the overall system.

The use of pilot signals provides for easier control because the detection process in the error correction circuitry may be optimised to known characteristics of the pilot signal. This optimisation may involve, for example, focusing detection on a certain frequency range or certain frequency separations.

A variety of pilot signals may be generated by the pilot signal generator 600. These include continuous wave (CW) carrier signals, full-carrier amplitude modulation (AM) signals, suppressed-carrier amplitude modulation (AM) signals, single sideband (SSB) signals, quadrature amplitude modulation (QAM) signals, filtered quadrature phase shift keyed (QPSK) signals, frequency-hopped carrier modulated signals, or two-tone signals. A requirement of the system is that the pilot signal levels be large enough to provide a reasonable level of distortion products whilst being small enough to allow virtually complete cancellation of the pilot signal at the output of the system. Accordingly, the level at which the pilot signals are injected into the RF input path may be optimised to account for these conflicting requirements.

Detailed embodiments based on the layout of FIG. 11 will now be described, with similar features being labelled with the same references. Each of these embodiments uses digital signal processing techniques which provide several advantages over analogue techniques, as explained with reference to the DSP used in FIG. 5. One notable advantage of using DSPs is their ability to overcome problems with DC offset build-up and drift.

It should be noted that the layout of FIG. 11 is an exemplary embodiment, and other layouts for a pilot based control scheme are possible within the scope of the present invention.

CW Pilot Signal Control

Figure 12:
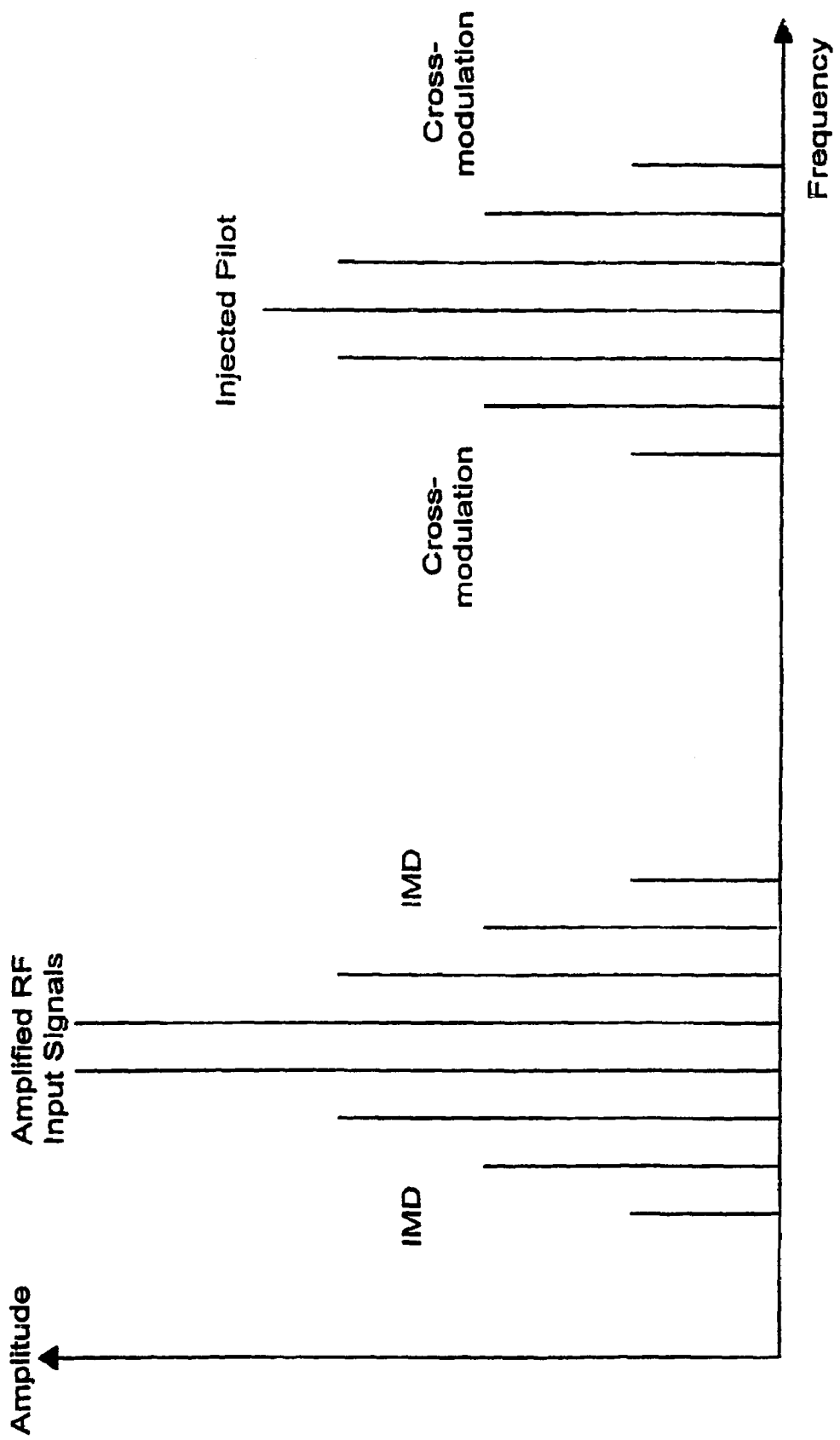
FIG. 12 is a frequency spectrum of an amplifier output when using a CW pilot control scheme.

This pilot based control scheme operates by measuring the non-linearity present in the amplifier 100 by injecting a CW pilot signal along with the RF input signals (although generally at a much lower level), and examining the cross-modulation components imposed upon the CW pilot signal due to the non-linearity present in the predistorted amplifier. A typical output spectrum of the anplifier 100 using this approach is shown in FIG. 12. The cross-modulation components around the CW pilot signal represent all relevant orders of distortion present in the amplifier (shown up to 7th order in FIG. 12) and consequently may be used as a measure of each order of distortion individually.

Since the pilot signal passes through both the predistorter 200 and the non-linear amplifier 100, as the predistorter 200 adapts and the overall system linearity is improved, so the cross-modulation present on the pilot signal will decrease. This cross modulation therefore provides an ideal measure of the non-linearity present in the system.

An advantage in using a CW pilot signal is that the signal is injected at a known frequency and hence may be detected or down converted using the original injection pilot signal frequency, or a frequency related to this pilot frequency. Thus the distortion information may be translated to a convenient frequency for detection, irrespective of the frequency content of the RF input signal.

Figure 13:
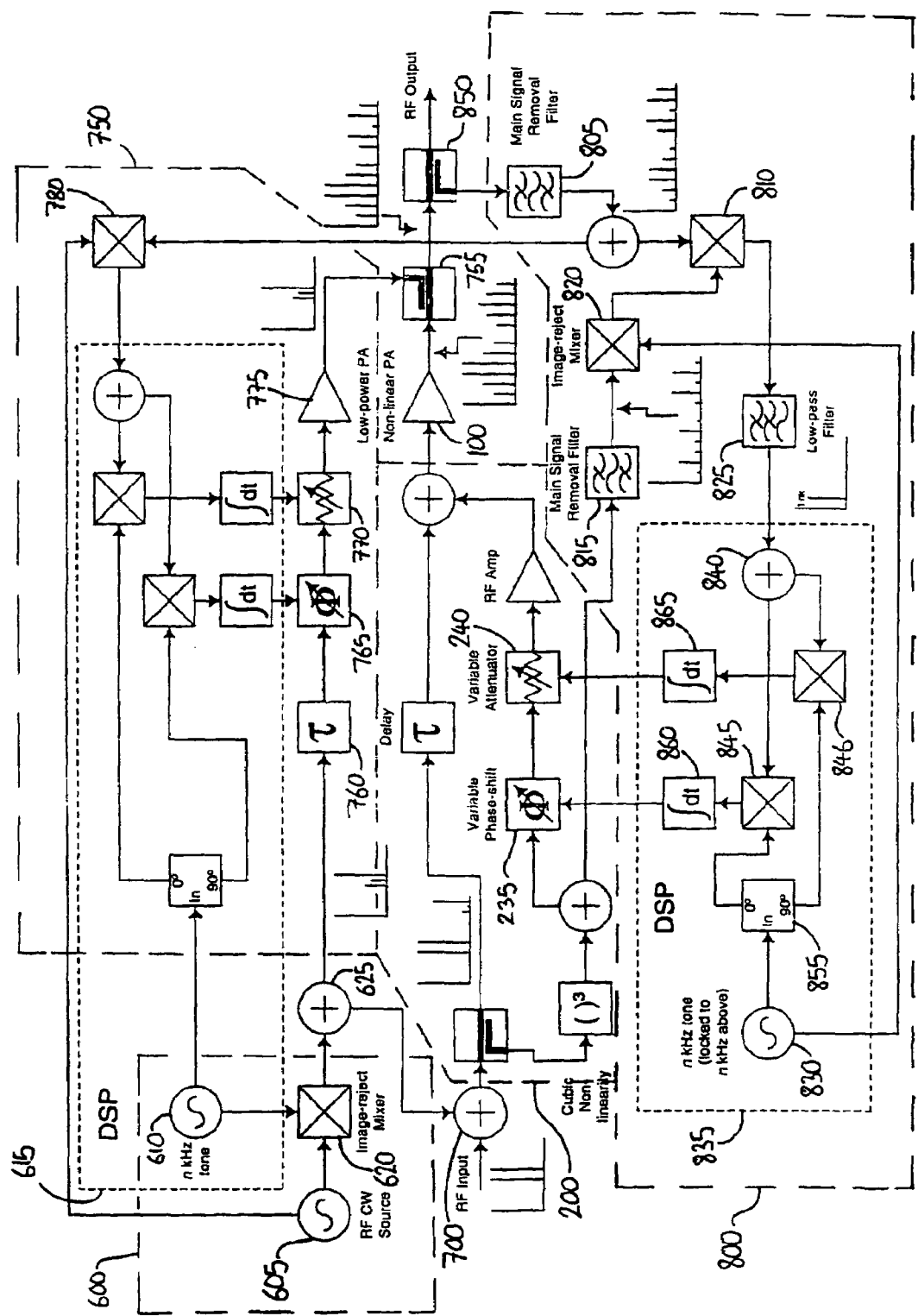
FIG. 13 is a block diagram of a predistorter arrangement based on the predistorter amplifier of FIG. 1 and further including a control scheme based on a CW pilot signal.

FIG. 13 shows a predistorter arrangement based on the predistorter amplifier of FIG. 1 and further including a control scheme based on a CW pilot signal. For simplicity, only the third order distortion path of the predistorter is shown together with a relevant third order feedback control circuit. It is apparent however that the predistorter control circuit may be extended to provide discrete control of all the distortion paths of the predistorter, ie. third, fifth, and seventh order and higher orders, as will be shown.

The pilot generator 600 in FIG. 13 comprises an RF oscillator 605 for generating a tone signal at a frequency $f_{cw}$, which is applied to a first input of an image reject (TR) mixer 620. A low frequency fixed oscillator 610 operating in a digital signal processor (DSP) 615 provides via a digital-to-analogue converter (not shown) a low frequency (LF) tone signal to a second input of the IR mixer 620. The LF tone signal is ideally at an audio frequency $f_{LF}$ of between 1 and 5 kHz. The IR mixer 620 outputs a pilot signal which is effectively a tone signal at a frequency $f_{cw}+f_{LF}$. The pilot signal is supplied via the splitter 625 to an adder 700 which adds the pilot signal to the RF input signal prior to predistortion 200.

Controlled removal of the amplified pilot signal from the output of the non-linear power amplifier 100 is performed using cancellation circuitry 750 which includes a directional coupler 755 in the output signal path. The pilot signal is supplied from a second output of the splitter 625 to a delay 760, a variable phase-shift 765, a variable attenuator 770, and a low power amplifier 775 which provide the pilot signal at a suitable amplitude and phase to cancel in the directional coupler 755 the amplified pilot signal.

The feedback circuit 800, 850 provides feedback control for the predistorter 200 and operates in three stages.

The first stage comprises sampling in a directional coupler 850 the power amplifier output after removal of the pilot signal. This sample is filtered by the main signal removal filter 805 to attenuate the amplified RF signal and distortion derived purely from the RF signal. The resulting signal is an error signal containing a relatively high proportion of amplifier generated distortion products derived from the pilot signal.

The second stage comprises correlating in a mixer 810 this error signal (after IR mixer frequency translation) with the output of the third order distortion generator so as to create a control signal representative of the amount of third order distortion derived from the pilot signal in the amplifier output spectrum. The output of the third order distortion generator is itself supplied to the mixer 810 via a main signal removal filter 815 which attenuates the third order distortion derived purely from the RF signal to create a signal containing a relatively high proportion of third order distortion products derived from the pilot signal. Correlation of this signal with the error signal in the correlation mixer 810 would produce a DC signal whose amplitude was representative of the third order distortion produced by the amplifier. However, information relating to what proportion of the distortion is third order AM-AM distortion and what proportion is third order AM-PM distortion is lost in the DC signal. Therefore, in order to maintain both amplitude and phase information in the output of the correlating mixer 810, the signal output from the main signal removal filter 815 is shifted up in frequency by an audio frequency $f_{LF}$ in an image reject mixer 820. The frequency shift is enabled by an audio frequency tone signal supplied to the IR mixer 820 from a low frequency fixed oscillator 830 operating in a digital signal processor (DSP) 835 which for simplicity is locked to the oscillator 610 in the DSP 615. The required output signal from the correlation mixer 810 is then at the audio frequency $f_{LF}$ and contains both amplitude and phase information concerning the third order distortion generated in the amplifier. The output of the correlation mixer 810 is passed through a low-pass filter 825 to attenuate unwanted higher frequency products and to prevent aliasing in a subsequent analogue-to-digital converter (not shown) which supplies the control signal to the DSP 835.

The control signal is supplied via a splitter 840 in the DSP 835 to two mixers 845, 846. The mixer 845 mixes the control signal with an in-phase tone signal at $f_{LF}$ from the phase quadrature component 855 to produce an output containing a DC signal for controlling the variable phase-shift 235 in the predistorter 200. Similarly, the mixer 846 mixes the control signal with a quadrature phase tone signal at $f_{LF}$ from the phase quadrature component 855 to produce an output containing a DC signal for controlling the variable attenuator 240 in the predistorter 200. Integrators 860 and 865 are provided in the output path of the mixers 845 and 846 respectively. The integrators each have a time constant which is set to cancel any unwanted higher frequency products but to allow for error correcting variations in the DC signals.

The DC signals from the mixers 845 and 846 will vary as the feedback circuit adjusts the phase and amplitude of the distortion signal in the predistorter 200 to minimise the distortion generated at the output of the amplifier 100. The feedback circuit will eventually reach a steady state whereby any deviation of the amplifier generated distortion from a minimum will result in a corresponding adjustment of the DC signals to counteract the change.

The error signal output from the main signal removal filter 805 is also used in a feedback control aspect of the cancellation circuit 750 for maintaining maximum cancellation of the amplified pilot signal in the directional coupler 755. The error signal is supplied to a first input of a mixer 780 and is mixed with the tone signal generated by the RF oscillator 605 at a frequency $f_{cw}$. The required signal from this correlation process is a tone signal at the frequency $f_{LF}$, ie. the difference between the pilot signal at $f_{cw}+f_{LF}$ and the tone signal at $f_{cw}$, and contains amplitude and phase information for controlling the variable phase shift 765 and the variable attenuator 770. The control signal output from the correlation mixer 780 is processed in the DSP 615 in an equivalent way to the control signal processed by the DSP 835.

In an alternative embodiment of the invention, the combinations of phase shifter and attenuator as used in the predistorter 200 and cancellation circuitry 750 can be replaced by a vector modulator.

Figure 14:
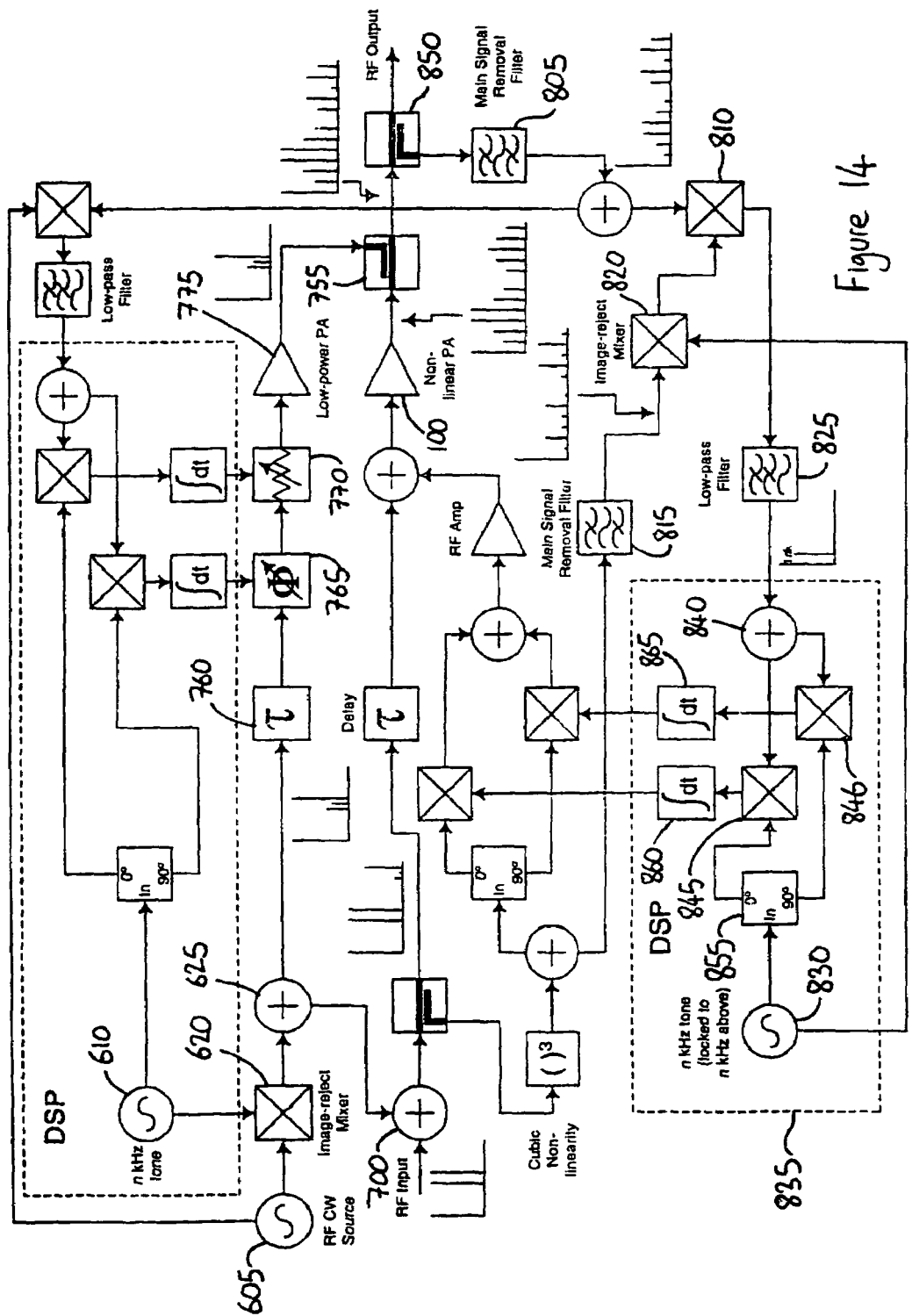
FIG. 14 is a block diagram of a predistorter arrangement using a single-order vector predistorter with a control system based on a CW pilot.

FIG. 14 shows a single-order vector predistorter with a control system based on a CW pilot. The operation of this system is similar to that described with reference to FIG. 13, with the exception that a vector modulator is now used as the control element in the predistorter third order non-linearity path.

Figure 15:
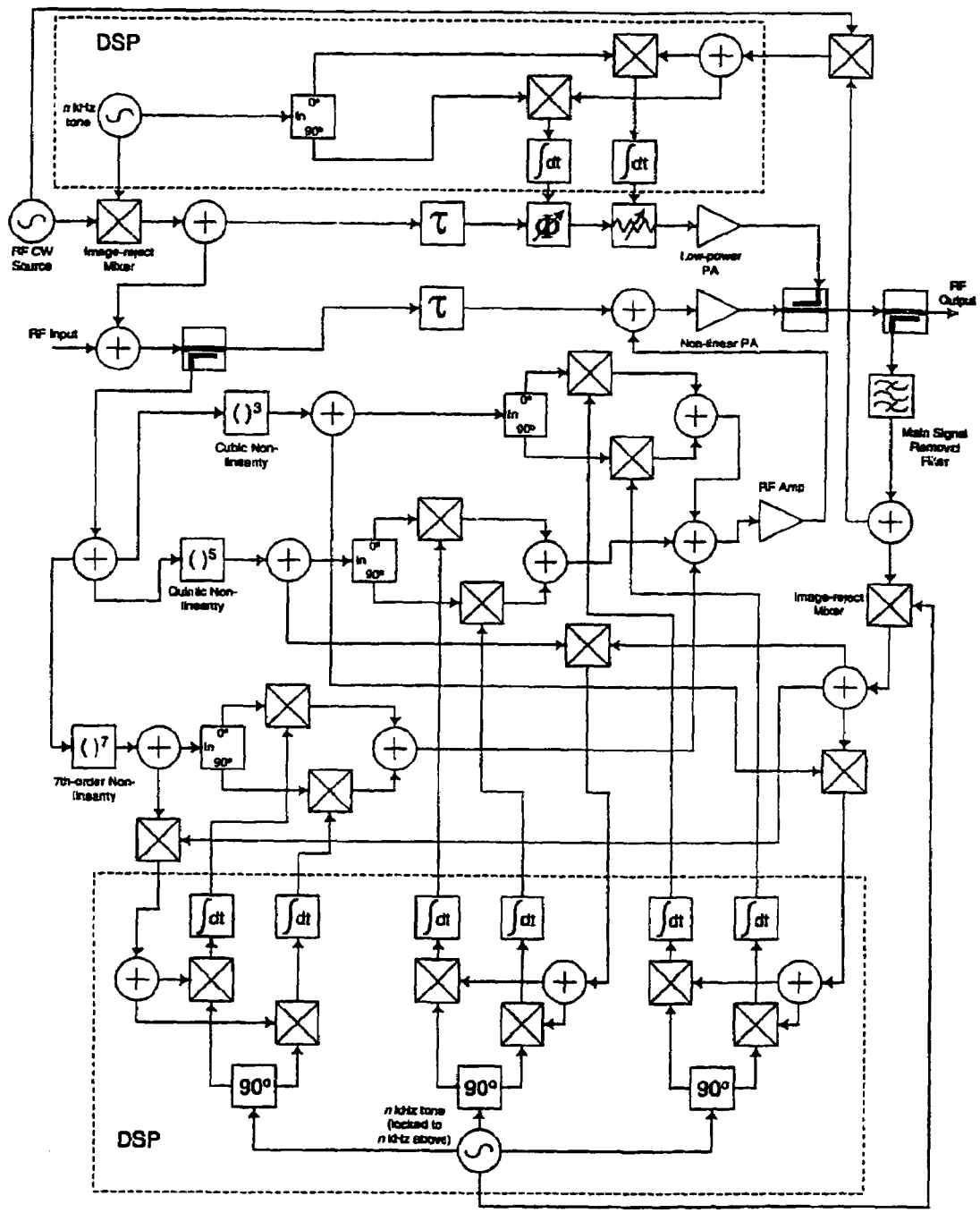
FIG. 15 is a block diagram of a predistorter arrangement as shown in FIG. 14 and extended to include a multi-order predistorter and corresponding control.

FIG. 15 extends the above principle to a multi-order predistorter. Each order is independently controlled by means of the relevant order of distortion from the non-linear generator. It is apparent that higher orders of distortion may also be controlled by further extending this system.

Figure 16:
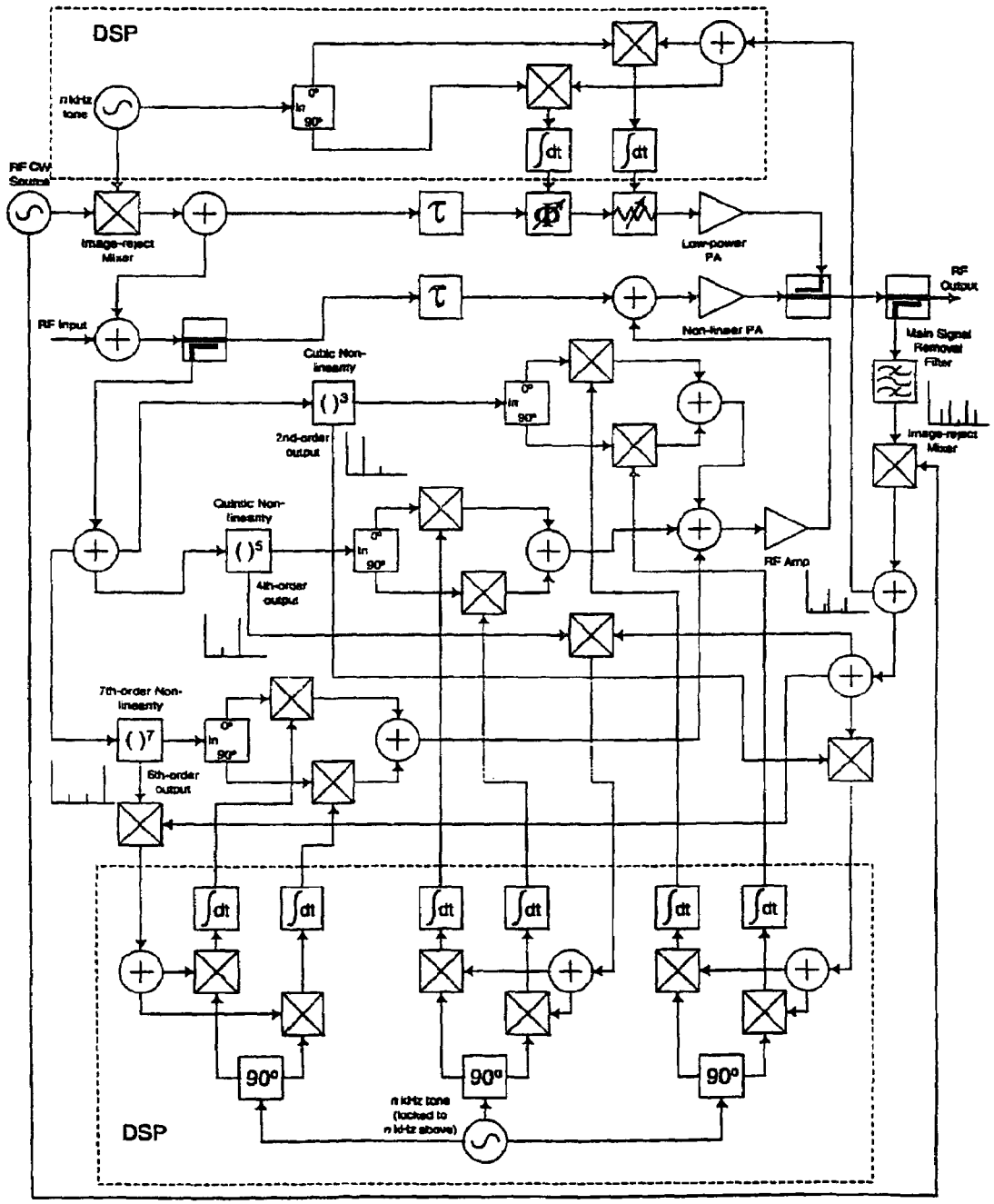
FIG. 16 is a block diagram of a predistorter arrangement employing an alternative mechanism for detecting the residual IMD level around the pilot signal based on the multi-order vector predistorter of FIG. 14.

An alternative mechanism for detecting the residual IMD level around the pilot signal is shown in FIG. 16 which is based on the multi-order vector predistorter shown in FIG. 15.

In this system, the detection mechanism utilises the baseband even-order distortion products which are by-products of odd-order distortion generation in the predistorter 200 (see FIG. 9b). These even-order products, appearing at base band (the double-frequency terms are ignored) are used to detect the distortion signals appearing around the pilot signal, after these signal have been down-converted to baseband by mixing with the original pilot signal.

Alternatively, the correlation could be performed between the baseband even-order products and the products surrounding the pilot at the pilot frequency; the result being a CW RP signal at the pilot frequency. This can then be down-converted by the pilot signal (at an appropriate audio frequency offset) and fed to the DSP control circuits.

Note that many combinations of the positioning of the image-reject filtering function are possible, for example, to offset the second, fourth and sixth outputs from the non-linearity generators in place of offsetting the RF output sample.

Two-tone Pilot Signal Control

According to one embodiment, a two-tone pilot based control scheme operates to generate a narrow-band two-tone test signal in which the tone-spacing is governed by a first oscillator implemented in a digital signal processor (DSP) and at a frequency just outside of the required linearisation band. This two-tone signal is inject into the input signal path and undergoes the same distortions produced by the predistorted amplifier as the RF input signal. The resulting intermodulation distortion products derived purely from the pilot signal will be at an accurately known spacing from the pilot signal and hence can be detected within the DSP by a second oscillator or a frequency-multiplied derivative of the first oscillator. Each harmonic of the first oscillator frequency can detect a specific order of intermodulation distortion, hence providing independent quadrature control in the predistorter of each order of distortion.

The pilot-tone itself, being narrow-band in nature, can be cancelled in the output signal to a high degree of accuracy, with a cancellation circuit incorporating a feedback control similar to the CW pilot control system of FIG. 13.

Figure 17:
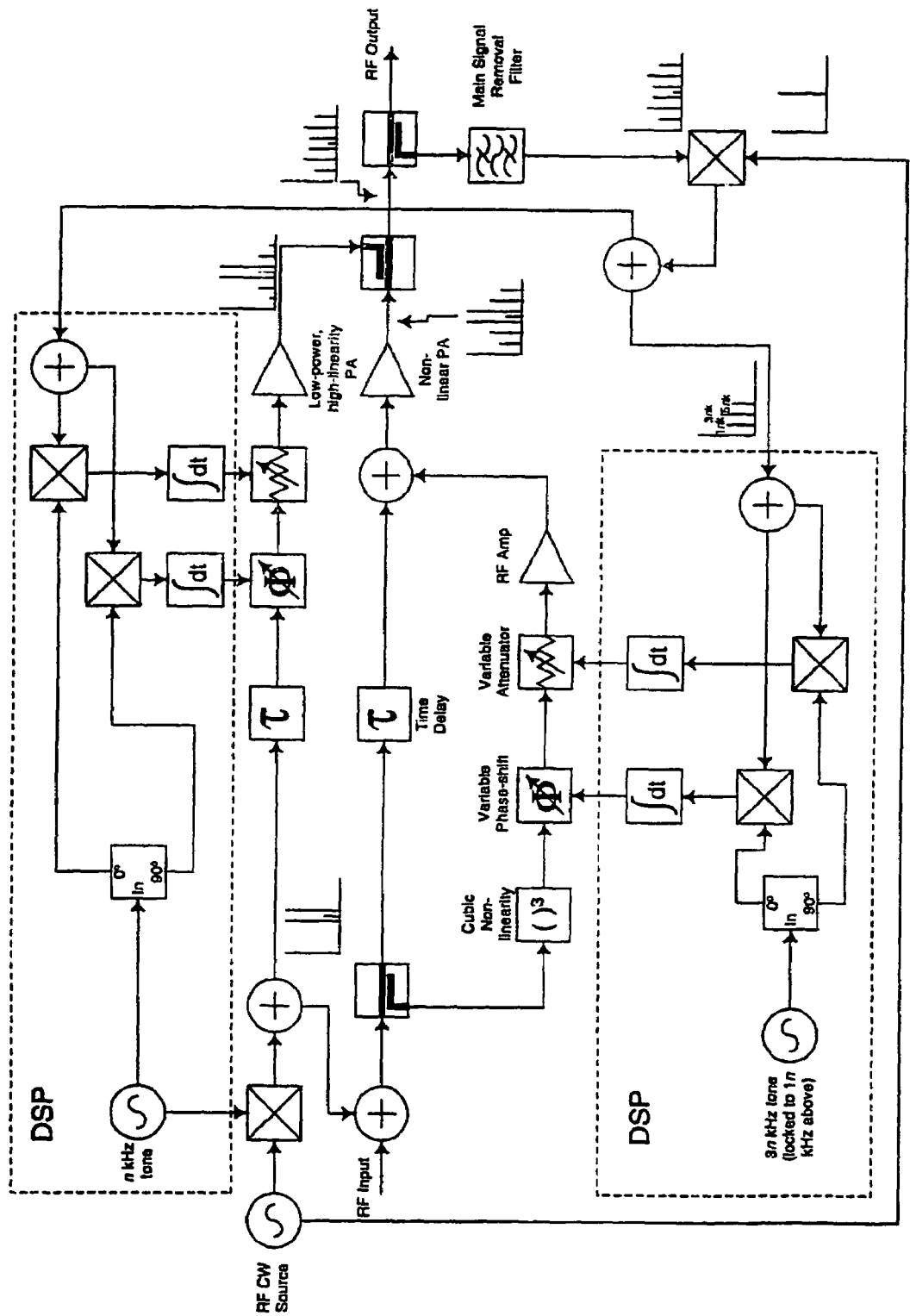
FIG. 17 is a block diagram of a predistorter arrangement including a control scheme based on a two-tone pilot signal.

A block diagram of an embodiment of this system, providing 3rd-order control, is shown in FIG. 17.

In this embodiment, the pilot signal cancellation amplifier has a high degree of linearity since intermodulation of the cancelling pilot signal in this amplifier will appear as additional distortion in the output spectrum of the RF output.

Figure 18:
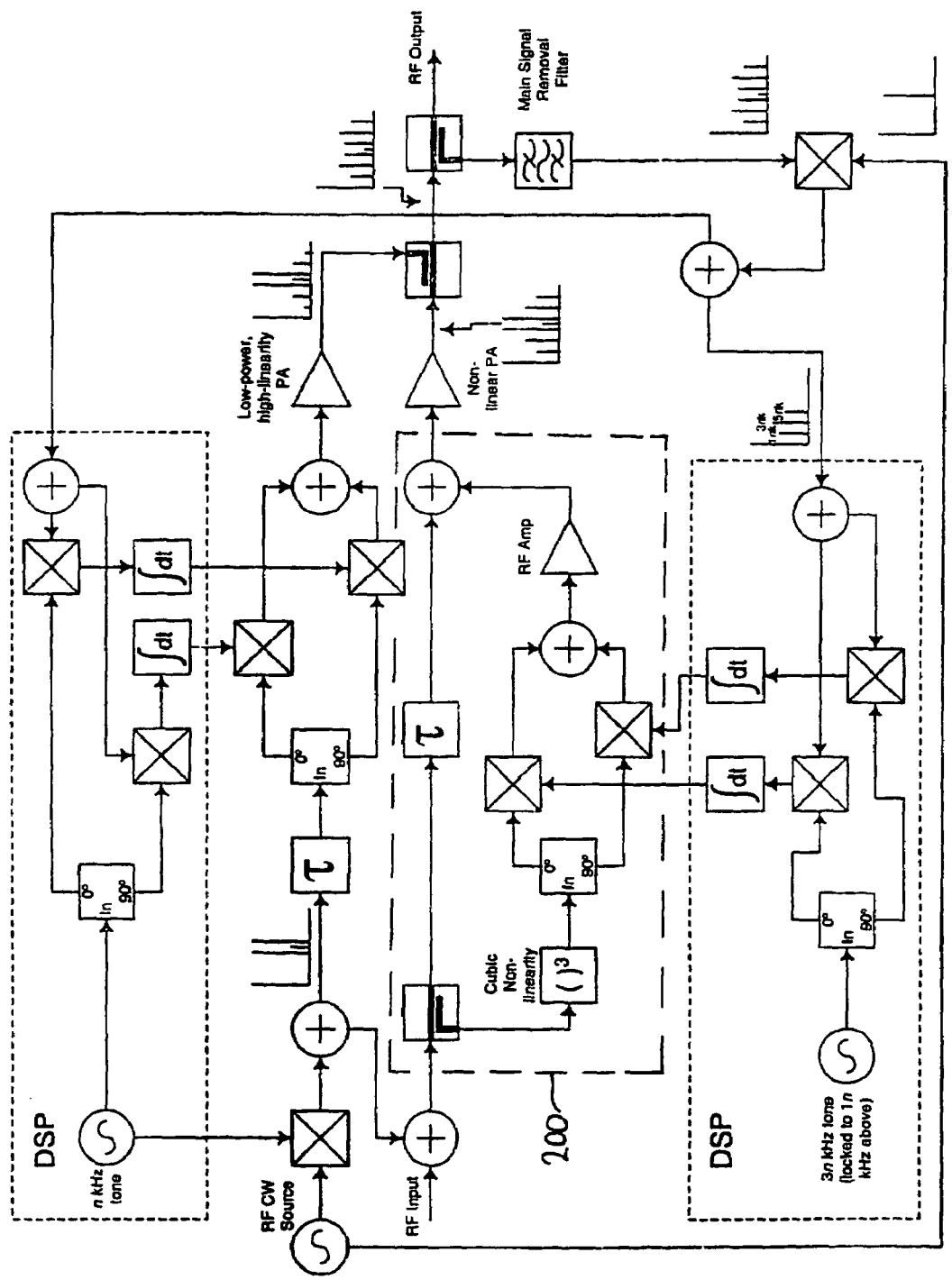
FIG. 18 is a block diagram of a predistorter arrangement using a single-order vector predistorter with a control system based on a two-tone pilot signal.

FIG. 18 shows a single-order vector predistorter with a control system based on a two-tone pilot signal. The operation of this system is similar to that described above, with the exception that a vector modulator is now used as the control element in the third order distortion generation path of the predistorter 200.

Figure 19:
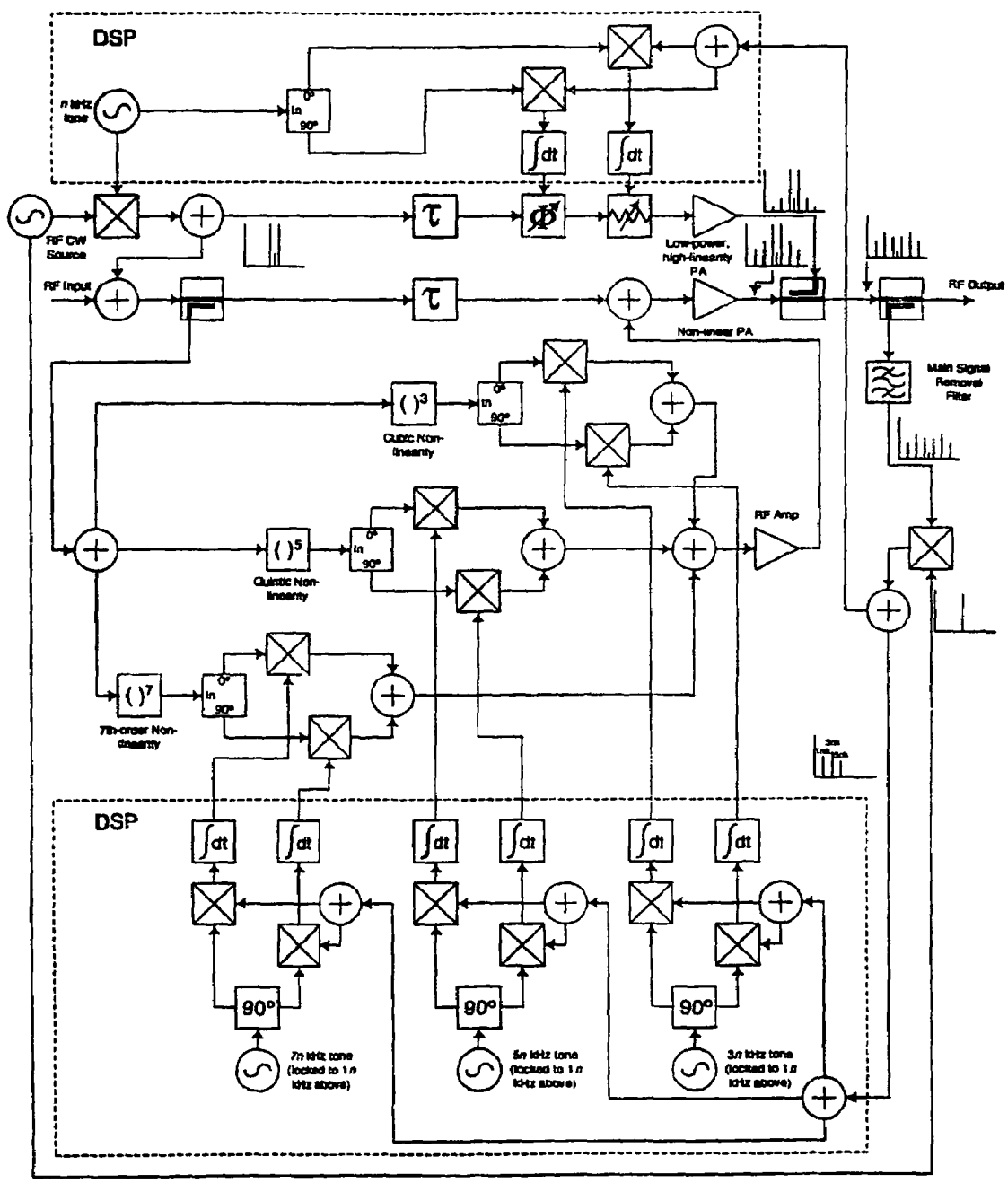
FIG. 19 is a block diagram of a predistorter arrangement using a multi-order vector predistorter with a control system based on a two-tone pilot.

FIG. 19 extends the above principle to a multi-order predistorter. Each order is independently controlled by means of the relevant harmonic of the original audio frequency oscillator. It is apparent that the principle of this control scheme may be extended to higher orders of distortion.

Figure 20:
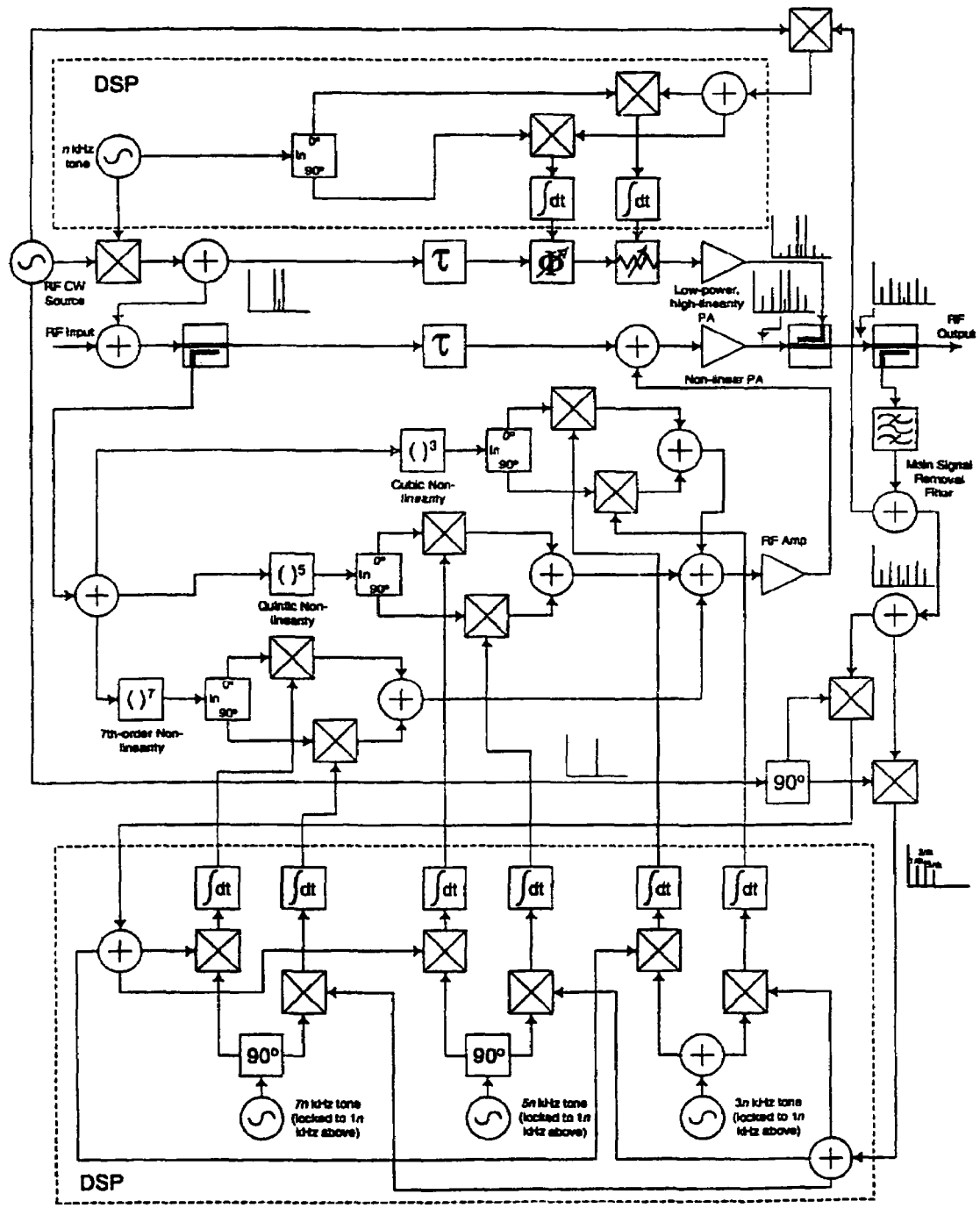
FIG. 20 is a block diagram of an improved version of the predistorter arrangement of FIG. 19 including a quadrature down-conversion scheme in the feedback circuit.

FIG. 20 shows an improved version of the embodiment of FIG. 19 and includes a quadrature down-conversion scheme in the feedback circuit to ensure that both amplitude and phase information is maintained in the resulting control signal.

A frequency hopped pilot signal has an advantage that the pilot signal may be placed in-band, with hopping providing sampling across a range of relevant frequencies. These frequencies could be selected so as not to coincide with the wanted signals passing through the amplifier or could be hopped randomly, with any 'clashes' being averaged out with the majority of 'no-clash' hops.

Two-Spread Spectrum Pilot Signal Control

The use of two spread-spectrum signals has an advantage of spreading the pilot signal energy over a wide bandwidth, hence potentially reducing the amount of cancellation of the pilot required at the output, in order to meet a given specification (eg 75 dBc).

Input-Signal Based Pilot Signal Control

This system operates by utilising a frequency-offset copy of the input signal as a pilot signal. This has the advantage that it is guaranteed to sound all of the amplifier channel of interest at any given instant in time and therefore provide an optimum adjustment for the predistorter. Provided the frequency offset is kept small, for example a few kHz or less, then the residual pilot signal appearing outside of the injected channels, and hence apparent as 'spurious signals', will be small. The majority of the pilot signal will in this case appear co-incendent with the RF input signal.

Figure 21:
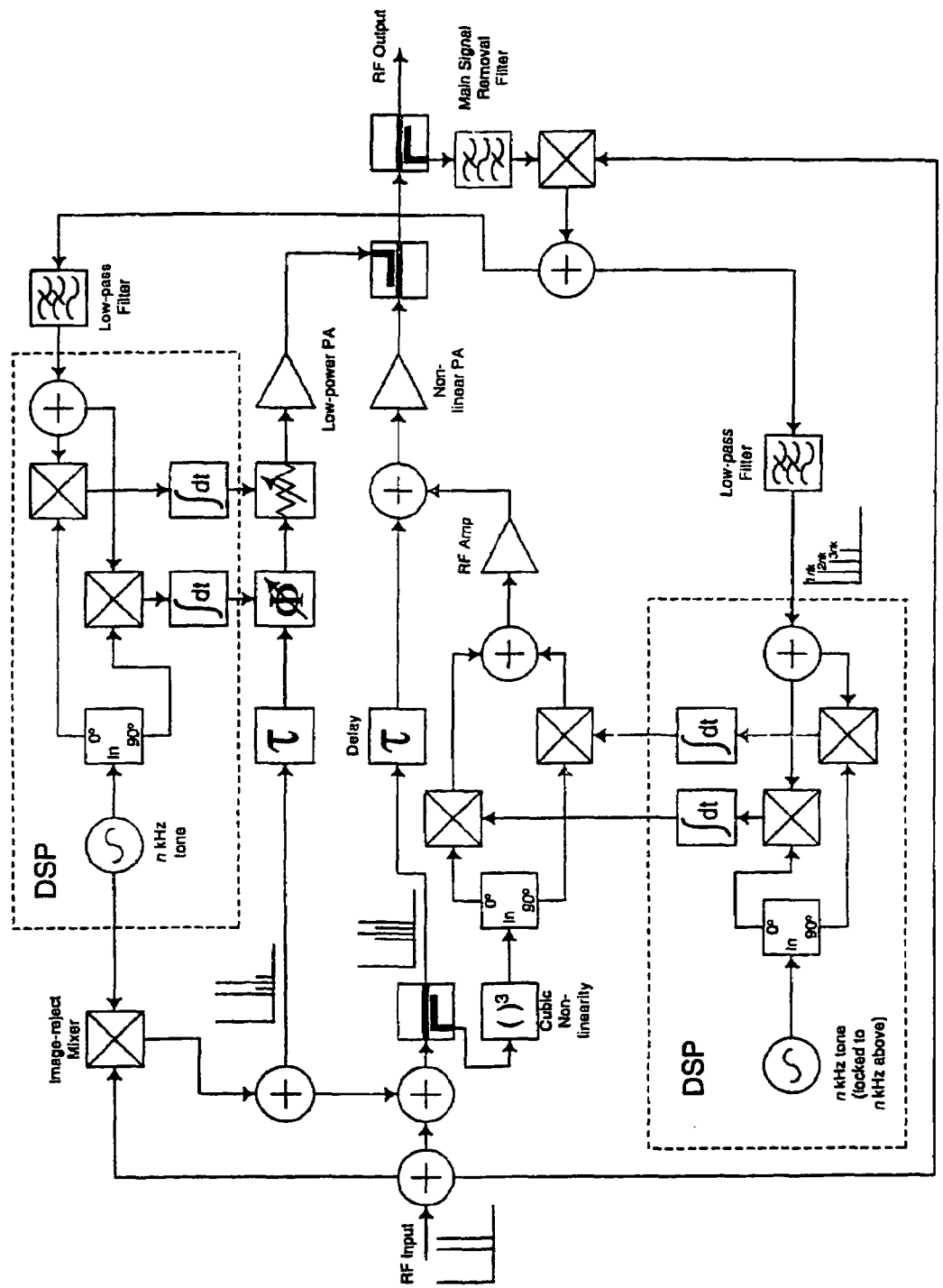
FIG. 21 is a block diagram of a predistorter arrangement employing a control system based on a pilot signal generated from the input signal.

A block-diagram of an embodiment of this control scheme, based on a third-order only predistorter, is shown in FIG. 21. This can be extended to multiple orders by a similar mechanism to that shown in FIG. 19 for the two-tone pilot described above, ie. using harmonics of the DSP offset-frequency to detect individual orders of distortion.

Dual Loop Predistorter

Figure 22:
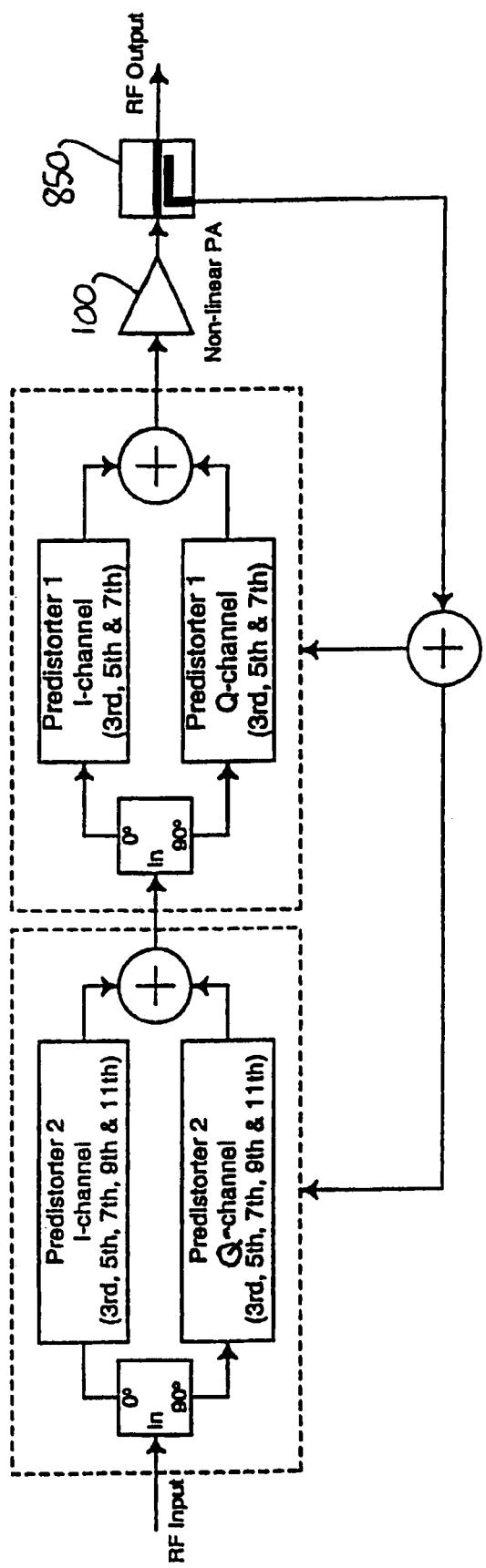
FIG. 22 is a block diagram of a basic dual-loop predistorter.

A block diagram of a basic dual-loop predistorter is shown in FIG. 22. The predistorter 2 operates to eliminate the gross distortions present in the amplifier and provides, for example, 25 dB of improvement. The predistorter 1 then operates to eliminate the residual distortion, including higher-orders not eliminated in predistorter 2, thus providing, for example, a further 25 dB of improvement which gives an overall improvement of 50 dB.

Predistorter 1 and predistorter 2 are controlled independently using separate pilot-based control circuits supplied with a common RF output sample as shown in FIG. 22. This independent control enables one of the predistorters to reach a steady state with the other predistorter locked before unlocking the other predistorter to allow it to reach a steady state. However, the major advantage in having independent control is that separate pilot signals may be used which enables each predistorter to achieve equivalent levels of distortion improvement. This is not achievable without pilot-based control.

As indicated in FIG. 22, both predistorters need not be identical in terms of complexity. In a typical amplifier, the degree of improvement required of the higher orders of distortion ($9^{th}$, $11^{th}$ etc) is significantly less than that required of the lower orders (to meet a given overall specification). It should therefore be possible to restrict the generation and use of these higher orders to only one of the predistorters, thus allowing the other predistorter to be less complex.

It may be possible to generate the various orders of distortion once and then make use of them twice (by splitting the output of each and feeding these to a separate vector modulator). This approach should simplify the predistorter arrangement, since a reasonable amount of the overall system complexity is in the generation of various orders of distortion.

It will be evident in view of the foregoing that various modifications may be made within the scope of the present invention. For example, the description refers to the use of certain components such as mixers and integrators which could be replaced by multipliers and low-pass filters respectively. Also, the embodiments are described with reference to polynomial predistorters operating at radio frequencies, whereas the invention may equally implemented in a base band predistorter or any other suitable predistorter.

The invention claimed is:

1. A predistorter arrangement for linearising a distorting element, the predistorter arrangement comprising:
 a pilot generator that generates a composite signal comprising an input signal and only a single pilot signal having only one frequency component at a time,
 a predistorter that predistorts the composite signal to produce a predistorted signal which is supplied to an input of the distorting element, and
 an error corrector that (1) receives a feedback signal corresponding to an output signal generated by the distorting element in response to the predistorted signal, (2) detects, in the feedback signal, cross-modulation distortion signals derived from cross-modulation of the input signal on the single pilot signal within the distorting element, wherein the cross-modulation of the input signal on the single pilot signal within the distorting element means that modulation of the input signal results in modulation of the single pilot signal in the output signal generated by the distorting element, (3) produces an error correction signal based on the detected cross-modulation distortion signals, and (4) applies the error correction signal to the predistorter to adjust the predistortion of the composite signal by the predistorter to reduce the cross-modulation distortion signals in the output signal subsequently generated by the distorting element.

2. A predistorter arrangement as claimed in claim 1, wherein the distorting element is an amplifier.

3. A predistorter arrangement as claimed in claim 2, further comprising a pilot remover located downstream of the amplifier that removes the amplified pilot signal from the amplifier output signal prior to or following detection of the presence of distortion signals derived from the single pilot signal in the amplifier output signal.

4. A predistorter arrangement as claimed in claim 1, wherein the pilot generator adds the single pilot signal to the input signal.

5. A predistorter arrangement as claimed in claim 1, wherein the single pilot signal is derived from the input signal.

6. A predistorter arrangement as claimed in claim 5, wherein the single pilot signal is a frequency translated version of a frequency component in the input signal.

7. A predistorter arrangement as claimed in claim 1, wherein the frequency of the single pilot signal is frequency hopped.

8. A predistorter arrangement as claimed in claim 1, wherein the predistorter comprises an input signal path for receiving an input signal which is required to be processed by the distorting element, and a distortion path in which an input signal from the input signal path is processed to generate a distortion signal, which is combined with the input signal in the input signal path to produce the predistorted input signal.

9. A predistorter arrangement as claimed in claim 8, wherein the error corrector correlates the distorting element output signal with the distortion signal to produce an error correction signal.

10. A predistorter arrangement as claimed in claim 9, wherein the distortion path includes an adjuster that adjusts the distortion signal in phase and amplitude in dependence on the error correction signal.

11. A predistorter arrangement as claimed in claim 10, wherein the adjuster comprises a variable phase shifter and a variable attenuator.

12. A predistorter arrangement as claimed in claim 10, wherein the adjuster comprises an in-phase adjuster and a quadrature phase adjuster.

13. A method for linearising a distorting element, the method comprising the steps of:
   generating a composite signal comprising an input signal and only a single pilot signal having only one frequency component at a time,
   predistorting the composite signal to produce a predistorted signal which is supplied to an input of the distorting element,
   receiving a feedback signal corresponding to an output signal generated by the distorting element in response to the predistorted signal,
   detecting, in the feedback signal, cross-modulation distortion signals derived from cross-modulation of the input signal on the single pilot signal within the distorting element,
   producing an error correction signal based on the detected cross-modulation distortion signals, wherein the cross-modulation of the input signal on the single pilot signal within the distorting element means that modulation of the input signal results in modulation of the single pilot signal in the output signal generated by the distorting element, and
   applying the error correction signal to the predistorter to adjust the step of predistorting the composite signal to reduce the cross-modulation distortion signals in the output signal subsequently generated by the distorting element.

14. A circuit comprising:
   a pilot generator that generates and adds only a single pilot signal having only one frequency component at a time to a received input signal to generate a composite signal comprising the received input signal and the single pilot signal;
   a predistorter that predistorts the composite signal to produce a predistorted signal;
   an amplifier that receives the predistorted signal and generates an amplifier output signal; and
   an error corrector that (1) receives a feedback signal corresponding to the amplifier output signal, (2) detects, in the feedback signal, cross-modulation distortion signals derived from cross-modulation of the input signal on the single pilot signal within the amplifier, wherein the cross-modulation of the input signal on the single pilot signal within the amplifier means that modulation of the input signal results in modulation of the single pilot signal in the output signal generated by the amplifier, (3) produces an error correction signal based on the detected cross-modulation distortion signals, and (4) applies the error correction signal to the predistorter to adjust the predistortion of the composite signal by the predistorter to reduce the cross-modulation distortion signals in the output signal subsequently generated by the amplifier.

15. The circuit of claim 14, wherein the single pilot signal is derived from the input signal.

16. The circuit of claim 15, wherein the single pilot signal is a frequency translated version of a frequency component in the input signal.

17. The circuit of claim 14, wherein the frequency of the single pilot signal is frequency hopped.

18. The method of claim 13, wherein the single pilot signal is derived from the input signal.

19. The method of claim 18, wherein the single pilot signal is a frequency translated version of a frequency component in the input signal.

20. The method of claim 13, wherein the frequency of the single pilot signal is frequency hopped.

\* \* \* \* \*